US012784646B2

(12) United States Patent
Cho et al.

(10) Patent No.: US 12,784,646 B2
(45) Date of Patent: Nov. 3, 2026

(54) CLOCK GENERATOR AND DISPLAY DEVICE INCLUDING THE SAME

(71) Applicant: LG Display Co., Ltd., Seoul (KR)

(72) Inventors: Soon Dong Cho, Paju-si (KR); Jae Won Han, Paju-si (KR); Jung Jae Kim, Paju-si (KR); Min Gyu Park, Paju-si (KR); Sang Uk Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/217,452

(22) Filed: May 23, 2025

(65) Prior Publication Data

US 2025/0285577 A1 Sep. 11, 2025

Related U.S. Application Data

(63) Continuation of application No. 18/476,175, filed on Sep. 27, 2023, now Pat. No. 12,333,993.

(30) Foreign Application Priority Data

Nov. 1, 2022 (KR) ........................ 10-2022-0143285

(51) Int. Cl.

| | |
|---|---|
| ***G09G 3/20*** | (2006.01) |
| ***G09G 3/3233*** | (2016.01) |
| ***H03K 5/13*** | (2014.01) |

(52) U.S. Cl.

CPC ......... *G09G 3/2096* (2013.01); *G09G 3/3233* (2013.01); *H03K 5/13* (2013.01); *G09G 2300/0842* (2013.01); *G09G 2310/08* (2013.01)

(58) Field of Classification Search

CPC ........................................................ H03K 5/13

See application file for complete search history.

(56) References Cited

U.S. PATENT DOCUMENTS 5,415,172 A * 5/1995 Tannaka ................ H03K 5/135 600/437
10,262,579 B2 4/2019 Zeng
(Continued)

FOREIGN PATENT DOCUMENTS

CN 110718192 A 1/2020
CN 112992057 A 6/2021
(Continued)

*Primary Examiner* — Bipin Gyawali
(74) *Attorney, Agent, or Firm* — Seed Intellectual Property Law Group LLP

(57) ABSTRACT

The present disclosure relates to a clock generator and a display device including the same. The clock generator includes a first clock generation circuit configured to output a clock, data, and a timing control signal; a first wiring through which the clock is serially transmitted; a second wiring through which the data is serially transmitted; a third wiring through which a pulse of the timing control signal is serially transmitted; a second clock generation circuit connected to the first clock generation circuit through the first wiring, the second wiring, and the third wiring and configured to generate pre-clocks in which phases are sequentially shifted based on the data and the clock; and a clock adjustment circuit configured to receive the pulse of the timing control signal and the pre-clock and output an output clock.

14 Claims, 16 Drawing Sheets

(56) References Cited

U.S. PATENT DOCUMENTS

| | | | | |
|---|---|---|---|---|
| 2002/0017962 | A1* | 2/2002 | Takagi | H03K 7/10 332/109 |
| 2006/0158554 | A1 | 7/2006 | Cho | |
| 2006/0220714 | A1 | 10/2006 | Hur | |
| 2008/0136805 | A1* | 6/2008 | Kawagoshi | G09G 3/3696 345/211 |
| 2008/0204099 | A1 | 8/2008 | Hur | |
| 2011/0157132 | A1 | 6/2011 | Byun et al. | |
| 2013/0082996 | A1 | 4/2013 | Kim et al. | |
| 2014/0104248 | A1 | 4/2014 | Won et al. | |
| 2014/0348281 | A1 | 11/2014 | Ko | |
| 2016/0063910 | A1 | 3/2016 | An | |
| 2017/0116914 | A1* | 4/2017 | Jeong | G09G 3/3225 |
| 2017/0315659 | A1* | 11/2017 | Kuroiwa | G09G 3/3648 |
| 2020/0020280 | A1 | 1/2020 | Han et al. | |
| 2020/0312249 | A1 | 10/2020 | Ji et al. | |
| 2021/0020137 | A1* | 1/2021 | Jang | G09G 3/3677 |
| 2021/0225291 | A1 | 7/2021 | Lee et al. | |
| 2022/0028320 | A1* | 1/2022 | Kim | G09G 5/12 |
| 2023/0419910 | A1 | 12/2023 | Lee et al. | |
| 2024/0144858 | A1* | 5/2024 | Cho | H03K 5/13 |

FOREIGN PATENT DOCUMENTS

| | | | |
|---|---|---|---|
| JP | 2018152825 | A | 9/2018 |
| KR | 2001-0058661 | A | 7/2001 |
| KR | 10-2006-0083636 | A | 7/2006 |
| KR | 2009-0073711 | A | 7/2009 |
| KR | 20100073739 | A | 7/2010 |
| KR | 20190037749 | A | 4/2019 |
| KR | 2020-0072228 | A | 6/2020 |

* cited by examiner

CLOCK GENERATOR AND DISPLAY DEVICE INCLUDING THE SAME

CROSS-REFERENCE TO RELATED APPLICATION

This application claims priority to and the benefit of Korean Patent Application No. 10-2022-0143285, filed Nov. 1, 2022, the disclosure of which is incorporated herein by reference in its entirety.

BACKGROUND

Technical Field

The present disclosure relates to a clock generator and a display device including the same.

Description of the Related Art

A driving circuit of a flat panel display (FPD) reproduces an input image on a pixel array by writing pixel data of an input image into pixels of a display panel. The driving circuit of such a display device includes a data driving circuit for supplying data signals to data lines, a gate driving circuit for supplying gate pulses to gate lines, a timing controller for controlling operation timings of the data driving circuit and the gate driving circuit, and the like.

The display device may include a clock generator for generating a clock input to a driving circuit of a display panel.

A clock generator and a level shifter require high frequency performance in order to generate a clock with high resolution. If the number of wirings through which the clock is transmitted between the clock generator and the level shifter is reduced, the clock may be transmitted through a high-frequency serial interface. To this end, a clock generator and a level shifter which have a high-performance are required, but this results in an increase in cost.

BRIEF SUMMARY

The present disclosure provides a clock generator capable of finely adjusting a clock and a display device including the same.

It should be noted that technical features and benefits of the present disclosure are not limited to those above-described, and other technical features and benefits of the present disclosure will be apparent to those skilled in the art from the descriptions herein.

A clock generator according to an embodiment of the present disclosure may include a first clock generation circuit configured to output a clock, data, and a timing control signal; a first wiring through which the clock is serially transmitted; a second wiring through which the data is serially transmitted; a third wiring through which a pulse of the timing control signal is serially transmitted; a second clock generation circuit connected to the first clock generation circuit through the first wiring, the second wiring, and the third wiring and configured to generate pre-clocks in which phases are sequentially shifted based on the data and the clock; and a clock adjustment circuit configured to receive the pulse of the timing control signal and the pre-clock and output an output clock. At least one of a rising time point, a pulse width, and a falling time point of the output clock may be adjusted by the pulse of the timing control signal.

The pulse of the timing control signal may be overlapped with at least one of the rising time point and a falling time point of the pre-clock.

A pulse width of the timing control signal may be smaller than a pulse width of the pre-clock.

When the pulse of the timing control signal overlaps with a pulse rising edge of the pre-clock, the pulse of the timing control signal may be rise before a pulse rising time point of the pre-clock and fall after the pulse rising time point of the pre-clock. When the pulse of the timing control signal overlaps with a pulse falling edge of the pre-clock, the pulse of the timing control signal may be rise before a pulse falling time of the pre-clock and fall after the pulse falling time of the pre-clock.

A time period in which the pulse of the timing control signal may be overlapped with a pulse of the pre-clock is less than one clock cycle of the clock.

The clock adjustment circuit may further include a delay circuit configured to delay the pre-clock and output the output clock. When the pulse of the timing control signal overlaps with the pulse rising edge of the pre-clock, the pulse of the output clock may rise at a time point delayed by a time from a pulse rising time point of the pre-clock to a pulse falling time point of the timing control signal. When the pulse of the timing control signal overlaps with a pulse falling edge of the pre-clock, the pulse of the output clock may fall at a time point delayed by a time from a pulse falling time point of the pre-clock to the pulse falling time point of the timing control signal.

The clock adjustment circuit may further include a filter circuit configured to include one or more logic circuit elements and generate the output clock. When the pulse of the timing control signal overlaps with a pulse falling edge of the pre-clock, the pulse of the output clock may fall at a rising time point of the timing control signal before a pulse falling time point of the pre-clock signal.

The clock generator may further include an output buffer configured to increase a swing width of a clock outputted from the clock adjustment circuit. The clock adjustment circuit and the output buffer may be included in the second clock generation circuit.

The timing control signal may include a delayed clock delayed from the clock by a time less than one clock cycle of the clock. The second clock generation circuit may cause the pre-clock to rise based on a value obtained by counting the clock or the delayed clock by a designated rising value of the data, and cause the pre-clock to fall based on a value obtained by counting the clock by a designated falling value of the data.

A clock generator according to an embodiment of the present disclosure may include a first clock generation circuit configured to generate a clock and data; a first wiring through which the clock is transmitted; a second wiring through which the data is transmitted; and a second clock generation circuit connected to the first clock generation circuit through the first wiring and the second wiring and configured to generate output clocks in which phases are sequentially shifted based on the data and the clock. The first clock generation circuit may vary a pulse rising time point of the clock and a pulse falling time point of the clock within a time smaller than one clock cycle of the clock. When the pulse rising time point of the clock and the pulse falling time point of the clock are varied, a pulse rising time point and a pulse falling time point of the output clock may be varied within a time less than the one clock cycle.

A display device according to an embodiment of the present disclosure may include a display panel configured to include a plurality of pixel circuits, in which each of the pixel circuits is connected to a data line and a gate line; a data driver configured to output a data signal applied to the data line; a gate driver configured to receive a clock and supply a gate pulse to the gate line; and a clock generator configured to supply the clock to the gate driver. The clock generator may include a first clock generation circuit configured to generate a clock, data, and a timing control signal; a first wiring through which the clock is transmitted; a second wiring through which the data is transmitted; a third wiring through which pulses of the timing control signal are transmitted; a second clock generation circuit connected to the first clock generation circuit through the first wiring, the second wiring, and the third wiring and configured to generate pre-clocks in which phases are sequentially shifted based on the data and the clock; and a clock adjustment circuit configured to receive the pulse of the timing control signal and the pre-clock and output an output clock. At least one of a rising time point, a pulse width, and a falling time point of the output clock may be adjusted by the pulse of the timing control signal.

A display device according to an embodiment of the present disclosure may include a display panel configured to include a plurality of pixel circuits, in which each of the pixel circuits is connected to a data line and a gate line; a data driver configured to output a data signal applied to the data line; a gate driver configured to receive a clock and supply a gate pulse to the gate line; and a clock generator configured to supply the clock to the gate driver. The clock generator may include a first clock generation circuit configured to output a clock and data; a first wiring through which the clock is transmitted; a second wiring through which the data is transmitted; and a second clock generation circuit connected to the first clock generation circuit through the first wiring and the second wiring and configured to generate output clocks in which phases are sequentially shifted based on the data and the clock. The first clock generation circuit may vary a pulse rising time point of the clock and a pulse falling time point of the clock within a time smaller than one clock cycle of the clock. When the pulse rising time point of the clock and the pulse falling time point of the clock are varied, a pulse rising time point and a pulse falling time point of the output clock may be varied within a time less than the one clock cycle.

The present disclosure may finely adjust the timing of a clock generated from a clock generation circuit with a time resolution higher than the frequency performance of the clock generation circuit. Accordingly, the present disclosure may implement a low-cost clock generator and display device capable of finely adjusting the clock.

The present disclosure may finely adjust the timing of a clock to increase the degree of freedom in designing various pixel driving methods and high-resolution display devices.

Effects which can be achieved by the present disclosure are not limited to the above-mentioned effects. That is, other objects that are not mentioned may be obviously understood by those skilled in the art to which the present disclosure pertains from the following description.

BRIEF DESCRIPTION OF THE SEVERAL VIEWS OF THE DRAWINGS

The above and other objects, features, and advantages of the present disclosure will become more apparent to those of ordinary skill in the art by describing embodiments thereof in detail with reference to the attached drawings, in which.

DETAILED DESCRIPTION

Figure 1:
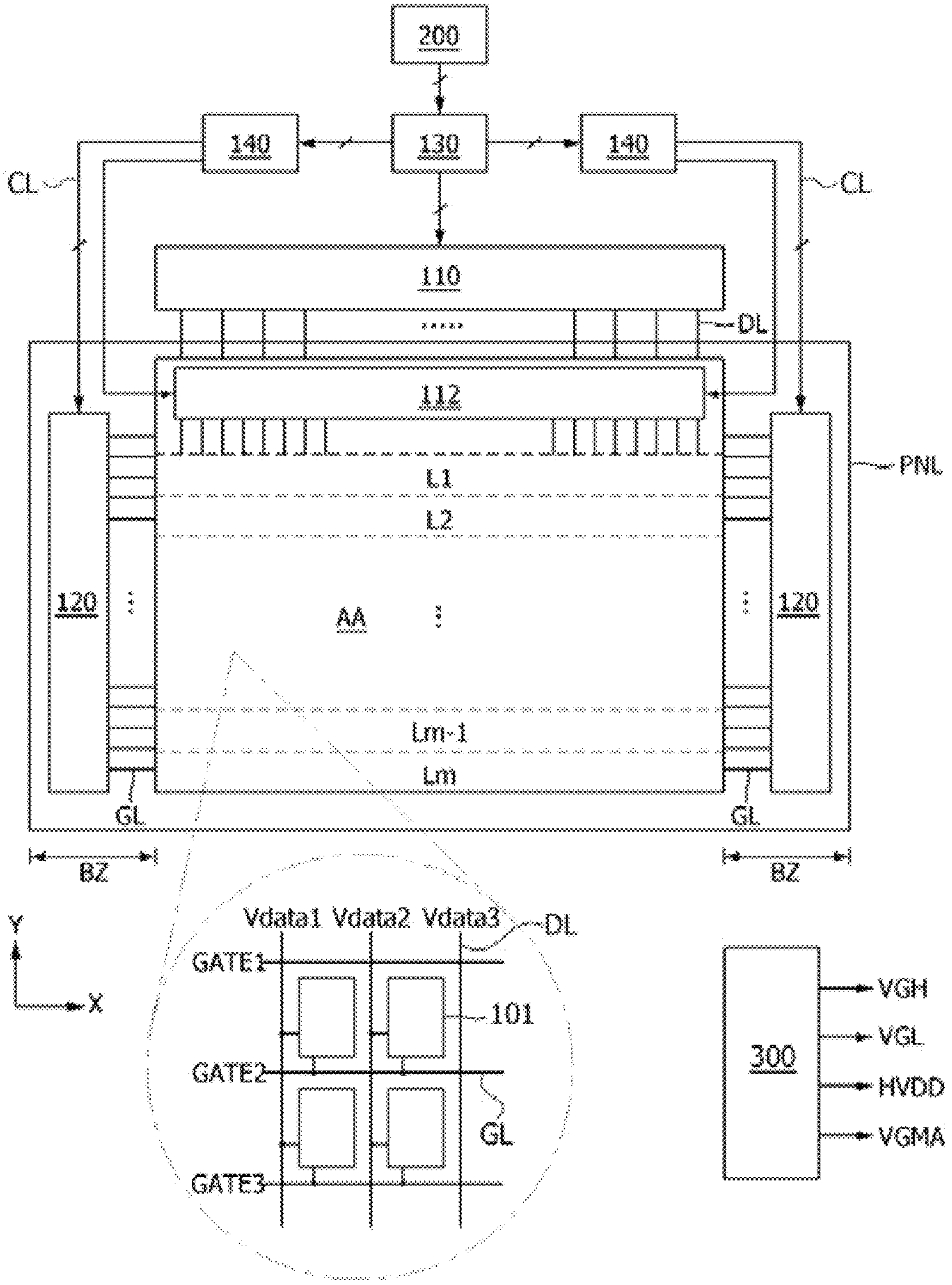
FIGS. 1 and 2 are diagrams illustrating a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When a positional or interconnected relationship is described between two components, such as "on top of," "above," "below," "next to," "connect or couple with," "crossing," "intersecting," or the like, one or more other components may be interposed between them, unless "immediately" or "directly" is used.

When a temporal antecedent relationship is described, such as "after," "following," "next to," "before," or the like, it may not be continuous on a time base unless "immediately" or "directly" is used.

The terms "first," "second," and the like may be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

In a display device of the present disclosure, a display panel driving circuit, a pixel array, a level shifter, and the like may include a plurality of transistors. Transistors may be implemented as oxide thin film transistors (oxide TFTs) including an oxide semiconductor, low temperature polysilicon (LTPS) TFTs including low temperature polysilicon, or the like.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS)), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate pulse swings between a gate-on voltage and a gate-off voltage. The gate-off voltage may be interpreted as a first voltage, and the gate-on voltage may be interpreted as a second voltage. A transistor is turned on in response to a gate-on voltage, while the transistor is turned off in response to a gate-off voltage. In the case of an n-channel transistor, the gate-on voltage may be a gate high voltage VGH, and the gate-off voltage may be a gate low voltage VGL. In the case of a p-channel transistor, the gate-on voltage may be the gate low voltage VGL and the gate-off voltage may be the gate high voltage VGH.

The present disclosure is applicable to any flat panel display device requiring a clock generator and a level shifter, such as a liquid crystal display (LCD) and an organic light emitting display (OLED display).

Hereinafter, various embodiments of the present disclosure will be described in detail with reference to the accompanying drawings.

Figure 2:
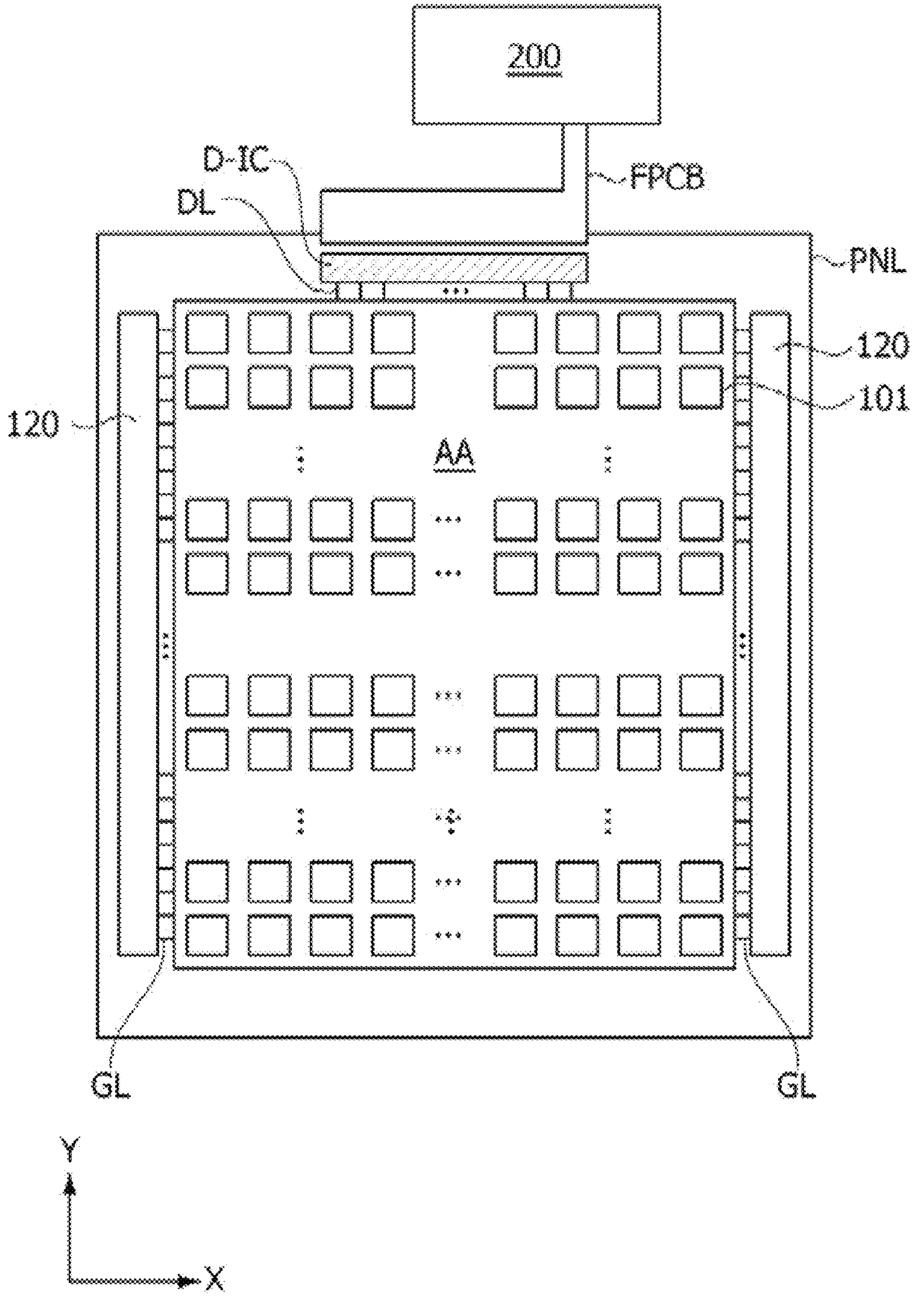

Referring to FIGS. 1 and 2, a display device according to an embodiment of the present disclosure includes a display panel PNL and a display panel driving circuit.

A display region of the display panel PNL includes a pixel array AA displaying pixel data of an input image. The pixel data of the input image is displayed on pixels of the pixel array AA. The pixel array AA includes a plurality of data lines DL, a plurality of gate lines GL intersecting the data lines DL, and pixels arranged in a matrix form. The arrangement of pixels may be formed in various ways, such as a form sharing pixels emitting the same color, a stripe form, a diamond form, or the like, in addition to the matrix form.

When a resolution of the pixel array AA is n*m, the pixel array AA includes n pixel columns and m pixel lines L1 to Lm intersecting the pixel columns. The pixel line includes pixels arranged along a first direction X. The pixel column includes pixels arranged along the first direction. One horizontal period (1H) is a time obtained by dividing one frame period by the number of m pixel lines L1 to Lm. Pixel data is written to pixels of one pixel line in one horizontal period (1H).

Each of the pixels includes two or more sub-pixels 101 for color implementation. For example, each of the pixels may be divided into a red sub-pixel, a green sub-pixel, and a blue sub-pixel. Each of the pixels may further include a white sub-pixel. Each of the sub-pixels 101 includes a pixel circuit. The pixel circuit includes a pixel electrode, one or more thin film transistors (TFTs), and a capacitor. The pixel circuit is connected to the data line DL and the gate line GL. In the case of an organic light emitting display device, the pixel circuit may be implemented with the circuit shown in FIGS. 3 and 4 but is not limited thereto.

Touch sensors may be disposed on the display panel PNL to implement a touch screen. A touch input may be sensed using separate touch sensors or sensed through pixels. The touch sensors may be disposed on the screen of the display panel in an on-cell type or add-on type, or implemented with in-cell type touch sensors embedded in a pixel array.

The display panel driving circuit writes data of an input image into pixels of the display panel 100 under the control of the timing controller 130. The display panel driving circuit may include a data driver 110, a gate driver 120, a timing controller 130 for controlling the operation timing of the drivers 110 and 120, a level shifter 140 connected between the timing controller 130 and the gate driver 120, and a power supply 300.

The data driver 110 converts pixel data of an input image received as digital signals from the timing controller 130 into analog gamma compensation voltages for each frame and outputs data signals Vdata1 to Vdata3. The data signals Vdata1 to Vdata3 outputted from the data driver 110 are supplied to the data lines DL. The data driver 110 may output data signals Vdata1 to Vdata3 using a digital to analog converter (hereinafter referred to as "DAC") that converts a digital signal into an analog gamma compensation voltage. The data driver 110 may be integrated into a source drive IC 110*a* shown in FIGS. 5A to 5C. The source drive IC 110*a* may be mounted on a chip on film (COF) 110*b* and connected between source PCBs 152 and 153 and the display panel 100. A touch sensor driver for driving touch sensors may be embedded in each of the source drive ICs 110*a*.

The display panel driving circuit may further include a demultiplexer array 112 disposed between the data driver 110 and the data lines DL.

The demultiplexer array 112 sequentially connects one channel of the data driver 110 to a plurality of data lines DL and distributes a data signal outputted from one channel of the data driver 110 to the data lines DL in a time division manner, such that the number of channels of the data driver 110 may be reduced.

The gate driver 120 may be formed in a bezel area BZ in which an image is not displayed in the display panel 100, or at least a portion thereof may be disposed in the pixel array AA. The gate driver 120 receives the clock received from the level shifter 140 and outputs a gate pulse GATE. The gate pulse GATE is supplied to the gate lines GL.

The gate pulses GATE1 to GATE3 applied to the gate lines GL turn on the switch elements of the sub-pixels 101 to select the pixels in which the voltages of the data signals Vdata1 to Vdata3 are charged. The switch element of the sub-pixel 101 is turned on in response to the gate-on voltage VGH of the gate pulses GATE1 to GATE3 and turned off in response to the gate-off voltage VGL. The gate pulse GATE swings between the gate-on voltage VGH and the gate-off voltage VGL. The gate driver 120 shifts the gate pulse using a shift register.

The timing controller 130 may multiply an input frame frequency by i and control the operation timing of the drivers 110 and 120 in the display panel with a frame frequency of the input frame frequency×i Hz (where "i" is a positive integer greater than 0). The frame frequency is 60 Hz in the National Television Standards Committee (NTSC) scheme and 50 Hz in the Phase-Alternating Line (PAL) scheme.

The timing controller 130 receives pixel data of an input image and timing signals synchronized with the pixel data from a host system 200. The pixel data of the input image received by the timing controller 130 is a digital signal. The timing controller 130 transmits the pixel data to the data driver 110. The timing signals include a vertical synchronization signal Vsync, a horizontal synchronization signal Hsync, a clock signal DCLK, a data enable signal DE, and the like. Since a vertical period and a horizontal period may be obtained by a method of counting the data enable signal DE, the vertical synchronization signal Vsync and the horizontal synchronization signal Hsync may be omitted. The data enable signal DE has a period of one horizontal period (1H).

The term synchronized is used herein in the broadest sense to include a range of different relationships between signals. Synchronized signals can include signals having pulses whose timing is exactly aligned with each other and also to include signals in which a rising or falling pulse on a first signal will be an alignment time to start a second signal, but the timing of the pulses, including their width, start and end times, rise and falls times and frequency are not alighted with the first signal and also to include the start timing of a second signal being based on a first signal, the second signal is at a different frequency and can even be a DC signal. Thus, if a pulse from one signal is the trigger or alignment for a second different signal, they can be said to be synchronized, even if the second signal does not further track, align with or follow the first signal.

The timing controller 130 may generate a data timing control signal for controlling the data driver 110, a gate timing control signal for controlling the gate driver 120, a control signal for controlling the switching elements of the demultiplexer array 112, and the like based on the timing signals received from the host system 200. The gate timing control signal may be generated as a digital signal voltage level clock.

The host system 200 may be one among a television (TV), a set-top box, a navigation system, a personal computer (PC), a home theater device, a mobile system, and a wearable system. In the mobile system and the wearable system, the data driver 110, the timing controller 130, and the level shifters 140 to 142 may be integrated in a single driver IC D-IC, as shown in FIG. 2. In the mobile system, the host system 200 may be implemented as an application processor (AP). The host system 200 may transmit pixel data of an input image to the driver IC D-IC through a mobile industry processor interface (MIPI). The host system 200 may be connected to the driver IC D-IC through a flexible printed circuit, for example, a flexible printed circuit (FPC).

A clock outputted from the level shifter 140 swings between the gate-on voltage VGH and the gate-off voltage VGL and is supplied to the gate driver 120 through clock lines CL. The clocks outputted from the level shifters 140 to 142 may be applied to at least one of the demultiplexer array 112, the gate driver 120, and the touch sensor driver.

The power supply 300 uses a DC-DC converter to generate a voltage required for driving the pixel array of the display panel 100 and the display panel driving circuit. The DC-DC converter may include a charge pump, a regulator, a buck converter, a boost converter, a buck-boost converter, and the like. The power supply 300 may adjust the DC input voltage from the host system 200 and generate a gamma reference voltage VGMA, a gate-on voltage VGH, a gate-off voltage VGL) a half VDD voltage HVDD, a common voltage of pixels, and the like. The half VDD voltage is as low as ½ voltage compared to VDD and may be used as the output buffer driving voltage of the source driver IC. The gamma reference voltage VGMA is supplied to the data driver 110. The gamma reference voltage VGMA is divided for each gray level through a voltage dividing circuit of the data driver 110 and supplied to the DAC of the data driver 110. The power supply 300 may generate a constant voltage commonly applied to pixels, for example, a common voltage Vcom, a pixel driving voltage EVDD, a pixel base voltage EVSS and the like.

Figure 3:
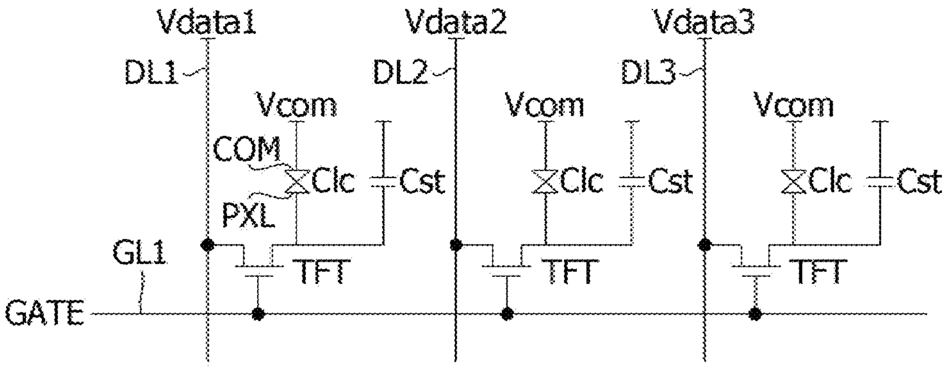
FIGS. 3 and 4 are circuit diagrams illustrating one example of a pixel circuit.
Figure 4:
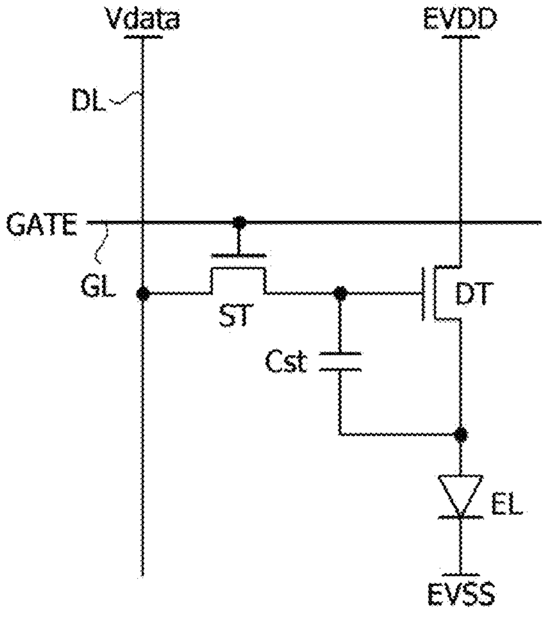

FIGS. 3 and 4 are circuit diagrams illustrating a pixel circuit according to an embodiment of the present disclosure. FIG. 3 is a pixel circuit of a liquid crystal display device, and FIG. 4 is a pixel circuit of an organic light emitting display device. It should be noted that the pixel circuit of the present disclosure is not limited to FIGS. 3 and 4.

Referring to FIG. 3, the pixel circuit includes a pixel electrode PXL, a common electrode COM, a liquid crystal cell Clc, a TFT connected to the pixel electrode PXL, and a storage capacitor Cst. The TFT is formed at an intersection of the data lines DL1 to DL3 and the gate line GL1. The TFT supplies data signals Vdata1 to Vdata3 from the data lines DL1 to DL3 to the pixel electrode PXL in response to the gate pulse GATE from the gate line GL1.

Referring to FIG. 4, the pixel circuit includes a light emitting element EL, a driving element DT supplying a current to the light emitting element EL, a switch element ST supplying a data signal Vdata to the gate electrode of the driving element DT in response to a gate pulse GATE, and a capacitor Cst connected between the gate electrode and the source electrode of the driving element DT The driving element DT and the switch element ST may be implemented with TFFs.

The pixel driving voltage EVDD may be applied to the drain electrode of the driving element DT through a power line PL connected to pixels in common. The driving element DT drives the light emitting element EL by supplying a current to the light emitting element EL depending on the gate-source voltage Vgs. The switch element DT is turned on in response to the gate-on voltage VGH of the gate pulse GATE. The light emitting element EL is turned on and emits light when a forward voltage between the anode electrode and the cathode electrode is greater than or equal to a threshold voltage. A pixel base voltage EVSS lower than the pixel driving voltage EVDD is applied to the cathode electrode of the light emitting element EL. The capacitor Cst is connected between the gate electrode and the source electrode of the driving element DT to maintain the gate-source voltage Vgs of the driving element DT.

The light emitting element EL may be implemented with an OLED including an organic compound layer formed between an anode and a cathode. The organic compound layer includes a hole injection layer (HIL), a hole transport layer (HTL), an emission layer (EML), an electron transport layer (ETL), and an electron injection layer (EIL), but is not limited thereto. When a voltage is applied to the anode electrode and the cathode electrode of the OLED, holes passed through the hole transport layer (HTL) and electrons passed through the electron transport layer (ETL) move to the light emitting layer (EML) to form excitons and emit visible light from the light emitting layer (EML). The OLED used as a light emitting element may have a tandem structure in which a plurality of light emitting layers are stacked. The OLED with a tandem structure may improve the luminance and lifetime of pixels.

There may be a difference in electrical characteristics of a driving element between pixels due to a process variation and element characteristic variation caused in a manufacturing process of a display panel. The difference in electrical characteristics of the driving elements may be more increased as the driving time of the pixels elapses. In order to compensate for the electrical characteristic variation of the driving element between pixels, an internal compensation circuit may be included in the pixel circuit shown in FIG. 4 or an external compensation circuit may be connected to the pixel circuit.

Figure 5A:
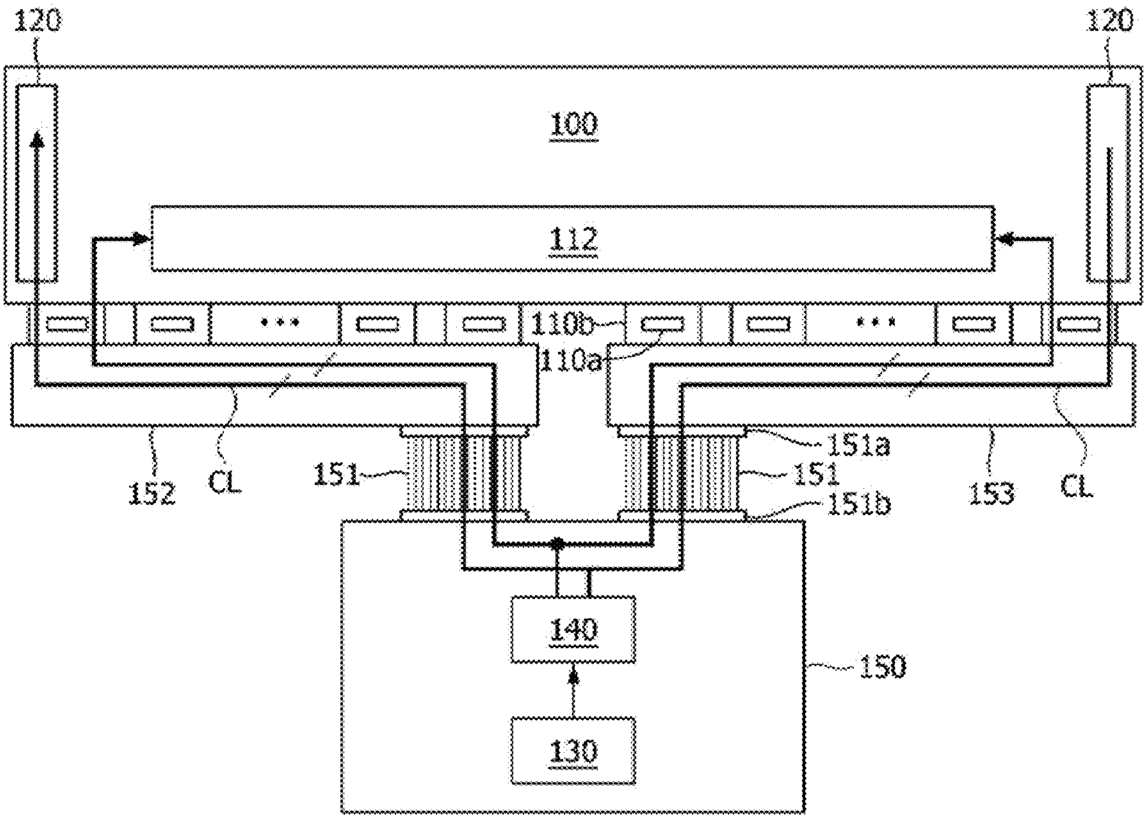
FIGS. 5A to 5C are diagrams illustrating various embodiments of a level shifter in a display device according to an embodiment of the present disclosure.
Figure 5B:
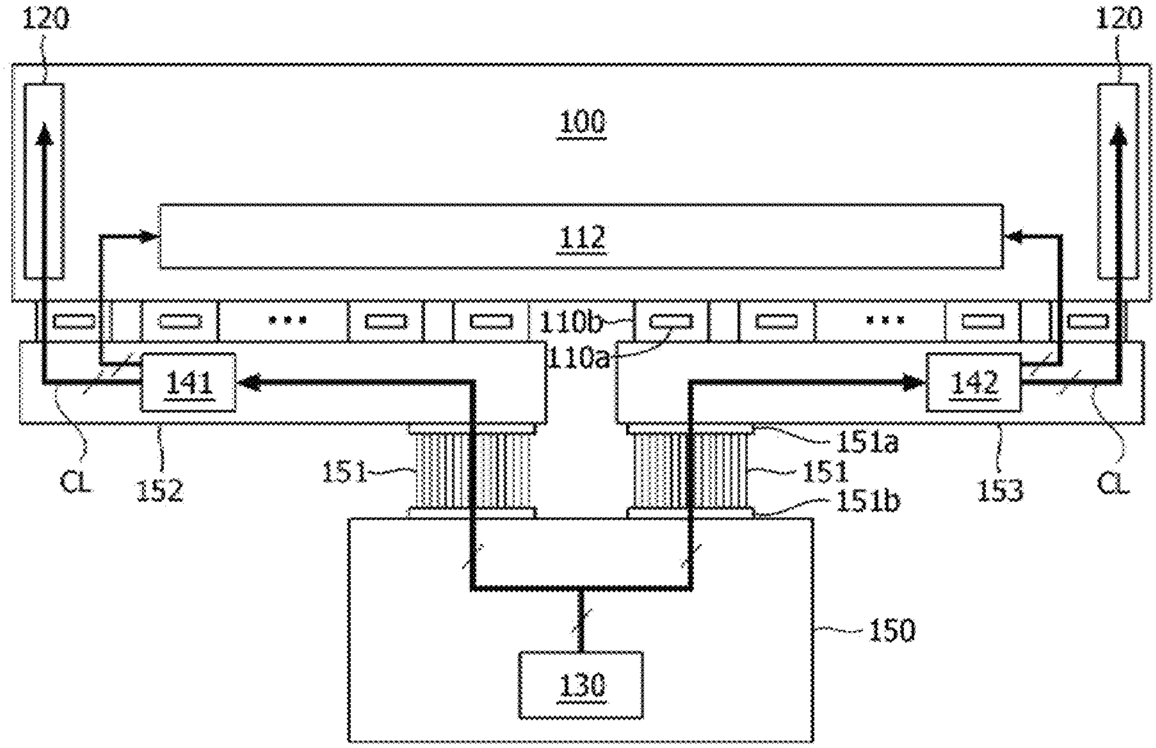
Figure 5C:
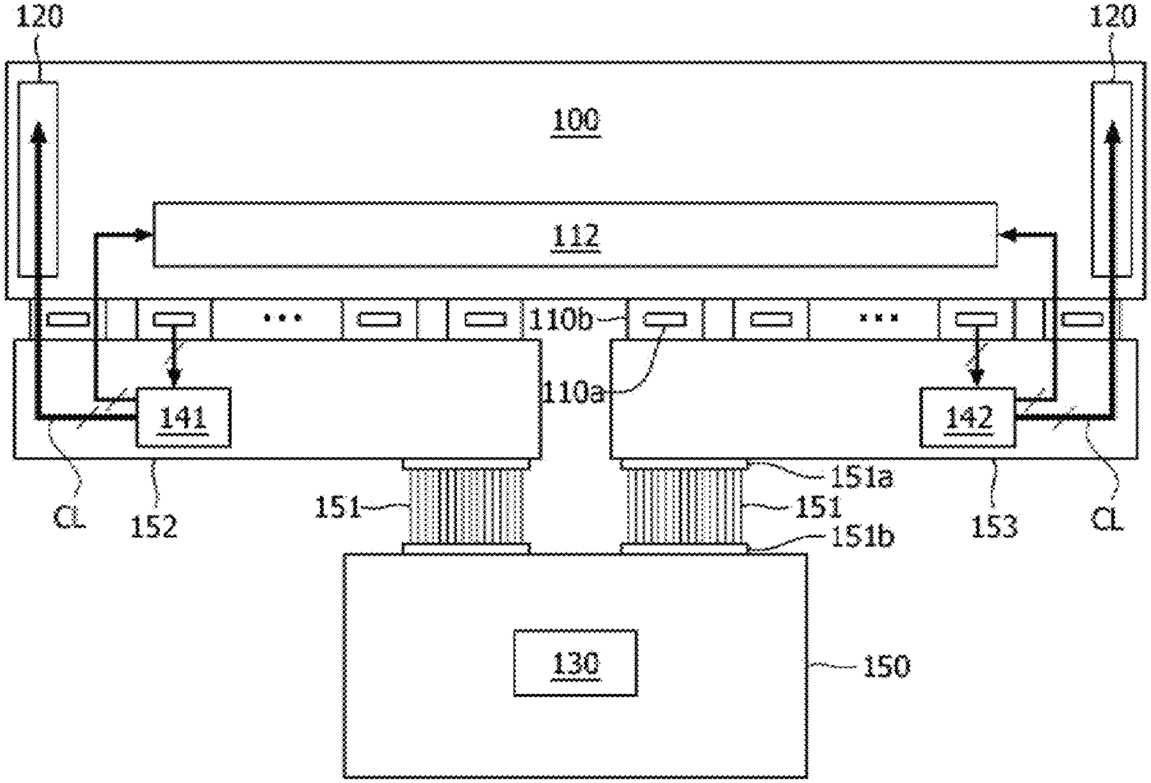

FIGS. 5A to 5C are diagrams illustrating various embodiments of a level shifter in a display device according to an embodiment of the present disclosure.

Referring to FIGS. 5A to 5C, a control board 150 may be connected to first and second source PCBs 152 and 153 through a flexible circuit substrate, for example, a flexible circuit board such as a flexible flat cable (FFC) 151 or FPCB and a connector 151*a*. Source drive ICs 110*a* are connected between the source PCBs 152 and 153 and a display panel 100. The source drive IC 110*a* receives pixel data from a timing controller 130 and outputs a data signal.

The timing controller 130 and the level shifter 140 may be mounted on the control board 150 as shown in FIG. 5A. In this case, the input terminals of the level shifter 140 are connected to the timing controller 130 through a wiring formed on the control board 150. The output terminals of the level shifters 140 to 142 may be connected to the gate driver 120 through wirings connecting the flexible circuit board 151, the source PCB 152, the flexible film 110*b*, and the gate driver 120 on the display panel 100.

The level shifters 140 to 142 may be mounted on the source PCBs 152 and 153, respectively, as shown in FIG. 5B. In this case, the level shifters 140 to 142 include a first level shifter 141 mounted on the first source PCB 152 and a second level shifter 142 mounted on the second source PCB 153. Input terminals of the level shifters 141 and 142 are connected to the timing controller 130 through wirings connecting the control board 150, the FFC 151, and the source PCBs 152 and 153. Output terminals of the level shifters 141 and 142 may be connected to the gate driver 120 through wirings connecting the source PCBs 152 and 153, the flexible film 110*b*, and the gate driver 120 on the display panel 100.

The level shifters 141 and 142 may be connected to the source drive ICs 110*a* as shown in FIG. 5C. The timing controller 130 may transmit a video data packet including pixel data of an input image and a control packet including various control information to the source drive ICs 110*a*. The timing controller 130 encodes gate timing control information into a control packet and transmits it to the source driver ICs 110*a*. The source drive ICs 110*a* may generate a gate timing control signal from the gate timing control information and provide it to the level shifters 141 and 142.

In FIGS. 5A to 5C, the level shifters 140 to 142 may receive gate timing information received from the timing controller 130 or the source drive ICs 110*a* to generate an output clock. The gate timing information may include a clock, data, and a timing control signal in FIG. 7. Output clocks of the level shifters 140 to 142 are inputted to the gate driver 130. The gate driver 130 shifts the clock received from the level shifters 140 to 142 using shift registers and sequentially supplies gate pulses to the gate lines GL.

Figure 6:
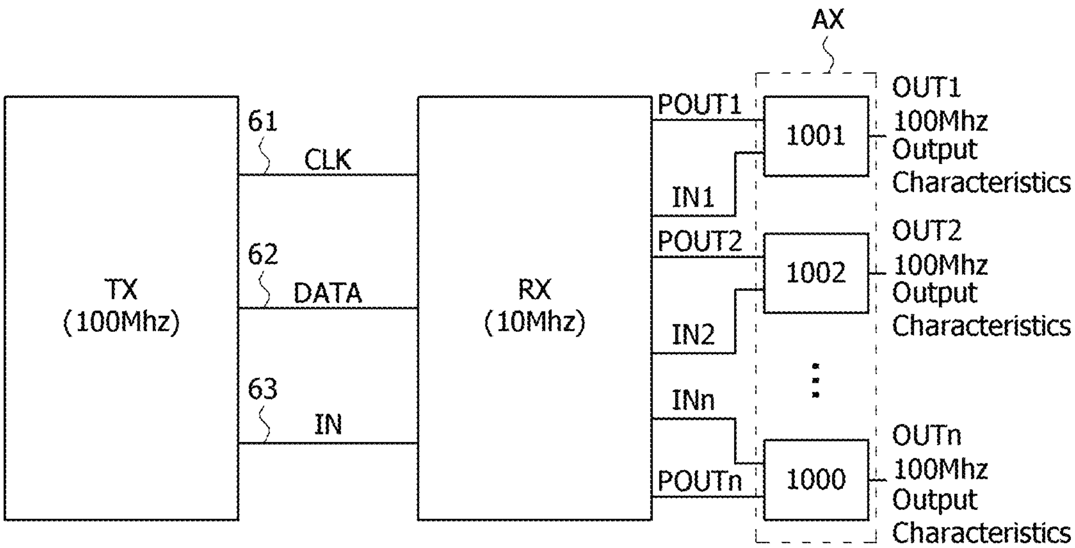
FIG. 6 is a diagram illustrating a clock generator according to a first embodiment of the present disclosure.
Figure 7:
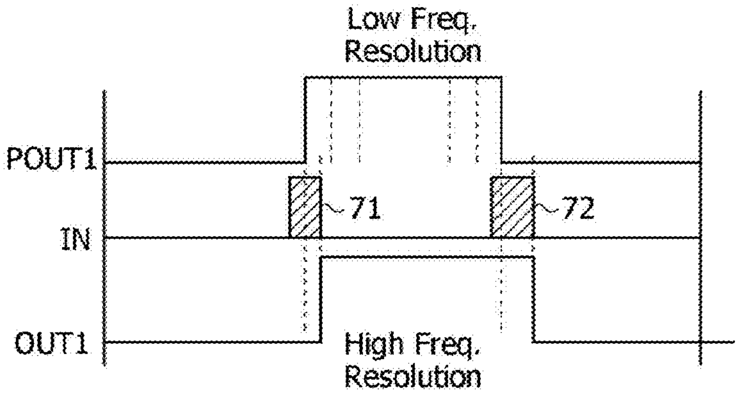
FIG. 7 is a waveform diagram illustrating one example of a pre-clock, a timing control signal, and an output clock shown in FIG. 6.

FIG. 6 is a diagram illustrating a clock generator according to an embodiment of the present disclosure. FIG. 7 is a waveform diagram illustrating one example of a pre-clock POUT, a timing control signal IN, and an output clock OUT shown in FIG. 6.

Referring to FIGS. 6 and 7, the clock generator includes a first clock generation circuit TX, a second clock generation circuit RX, and a clock adjustment circuit AX. The clock adjustment circuit AX may include first to n-th clock adjustment parts 1001 to 100*n* corresponding to the number of output channels of the second clock generation circuit RX.

The first clock generation circuit TX may be connected to the second clock generation circuit RX through a serial interface including a first wiring (or clock wiring) 61, a second wiring (or data wiring) 62, and a third wiring 63. The first clock generation circuit TX serially transmits the clock CLK and data DATA through the clock wiring and the data wiring at a frequency that may be sampled in the second clock generation circuit RX, for example, at a frequency of 10 MHz. The data DATA is synchronized with the clock CLK. The first clock generation circuit TX may have high frequency performance, for example, the ability to generate the clock CLK at a frequency of 100 MHz.

The first clock generation circuit TX serially transmits the pulse of the timing control signal IN to the second clock generation circuit RX through the third wiring 63. The pulse of the timing control signal IN is synchronized with the clock CLK. Namely, based on a clock signal pulse, the timing control signal IN has one or more pulses that are generated, however, it does not have all of its pulse widths, frequency, and other features exactly aligned with the clock pulses and its frequency. The timing control signal IN is transmitted to the second clock generation circuit RX at a frequency lower than the frequencies of the clock CLK and the data DATA, but a rising time point, a pulse width and a falling time point of the pulse may be varied with a time resolution possible at a high-frequency, for example, 100 MHz.

The second clock generation circuit RX is connected to the first clock generation circuit TX through the first wiring 61, the second wiring 62, and the third wiring 63. The second clock generation circuit RX generates pre-clocks POUT1 to POUTn in which phases are sequentially shifted based on the data DATA and the clock CLK. Each of the clock adjustment parts 1001 to 100*n* may receive the pulse of the corresponding timing control signals IN1 to INn and the pre-clocks POUT1 to POUTn, and fine-adjust one or more of the rising time point, the pulse width, and the falling time point of pre-clocks POUT1 to POUTn to generate the output clocks OUT1 to OUTn.

The second clock generation circuit RX provides the first to nth pre-clocks POUT1 to POUTn sequentially shifted through n channels (n is a positive integer greater than or equal to 2) to the corresponding clock adjustment parts 1001 to 100*n*. The second clock generation circuit RX may separate the pulses of the serially received timing control signal IN for each channel IN1-INn to finely adjust the timing of the first to n-th pre-clocks POUT1 to POUTn for each channel in the clock adjustment circuit AX. The second clock generation circuit RX may sample the pulses of the timing control signal IN serially received from the first clock generation circuit TX for each channel and supply them IN1-INn to the clock adjustment parts 1001 to 100*n* of the corresponding channel. Compared to the input timing control signal IN, the frequencies of the timing control signals IN1 to INn provided to the clock adjustment parts 1001 to 100*n* may be lowered to 1/n or less of the input timing control signal IN.

The first clock adjustment part 1001 receives pulses of the first pre-clock POUT1 and the first timing control signal IN1 from the first channel of the second clock generation circuit RX, so that one or more of the rising time point, the pulse width, and the falling time point of the first pre-clock POUT1 may be finely adjusted to generate the first output clock OUT1. The second clock adjustment part 1002 receives pulses of the second pre-clock POUT2 and the second timing control signal IN2 from the second channel of the second clock generation circuit RX to allow one or more of the rising time point, pulse width, and falling time point of the second pre-clock POUT1 to be finely adjusted to generate the second output clock OUT2.

The second clock generation circuit RX generates the pre-clocks POUT1 to POUTn at a frequency lower than the input clock CLK and the data DATA, for example, at a frequency of 10 MHz. The second clock generation circuit RX may be implemented with a circuit with lower frequency performance than the first clock generation circuit TX.

The second clock generation circuit RX counts the clock CLK as much as a value of the data DATA and causes the clock pulse to rise and fall to generate the pre-clocks POUT1 to POUTn. For example, if the value of the data DATA is '2', the second clock generation circuit RX causes the pre-clocks POUT1 to POUTn to rise when the clock count value is '2', and then if the value of the data DATA is '22', the second clock generation circuit RX causes the pre-clocks POUT1 to POUTn to fall and outputs the pre-clocks POUT1 to POUTn with a relatively lower frequency than the input clock CLK when the clock count value is '22'. Therefore, the second clock generation circuit RX may determine a rising edge, a pulse width, and a falling edge of the pre-clocks POUT1 to POUTn based on the number of clocks indicated by the data DATA. The rising time point, pulse width, and falling time point of the pre-clocks POUT1 to POUTn may be adjusted in units of one clock cycle of the input clock CLK.

Each of the clock adjustment parts 1001 to 100*n* may finely adjust the rising time point and falling time point of the pre-clocks POUT1 to POUTn to generate the output clocks OUT1 to OUTn using the timing control signals IN1 to INn. Each of the clock adjustment parts 1001 to 100*n* may precisely control the timing of the output clocks OUT1 to OUTn using one of a delay circuit and a filter circuit. A time period in which the pulses of the timing control signals IN1 to INn overlap with the pulses of the pre-clock signals POUT1 to POUTn may be set to a value smaller than one clock cycle of the clock CLK ('T' in FIGS. 12A and 12B). Each of the clock adjustment parts 1001 to 100*n* may finely adjust the timings of the pre-clocks POUT1 to POUTn with a time resolution smaller than 1 clock cycle T. For example, the clock adjustment parts 1001 to 100*n* may generate the output clocks OUT1 to OUTn that are finely adjusted in at least one of a rising time point, a pulse width, and a falling time point with time resolution capability possible at a frequency of 100 MHz from the respective pre-clocks POUT1 to POUTn. Accordingly, the clock adjustment parts 1001 to 100*n* may generate the output clocks OUT1 to OUTn in which the timings are adjustable beyond the frequency performance of the second clock generation circuit RX.

When it is necessary to fine-adjust one or more of the rising time point, the pulse width, and the falling time of the output clocks OUT1 to OUTn to be provided to the gate driver 120, the first clock generation circuit TX may precisely control the output clocks OUT1 to OUTn by changing the timing of the timing control signal IN. When the pulses of the timing control signals IN1 to INn overlap with the pulse rising edges of the pre-clocks POUT1 to POUTn, the pulses of the timing control signals IN1 to INn may rise before the pulse rising edges of the pre-clocks POUT1 to POUTn and fall after the pulse rising time points of the pre-clocks POUT1 to POUTn. When the pulse of the timing control signal IN overlaps with the pulse falling edges of the pre-clock signals POUT1 to POUTn, the pulse of the timing control signal IN may rise before the pulse falling time points of the pre-clock POUT1 to POUTn and may fall after the pulse falling time points of the pre-clocks POUT1 to POUTn.

When the pulses of the timing control signals IN1 to INn overlap with the pulse rising edges of the pre-clocks POUT1 to POUTn, the pulses of the output clocks OUT1 to OUTn may rise at a time point delayed by a time point delayed by a time from the pulse rising time points of the pre-clocks POUT1 to POUTn to a pulse falling time point of the timing control signal IN. When the pulses of the timing control signals (IN1 to INn) overlap with the pulse falling edges of the pre-clocks POUT1 to POUTn, the pulses of the output clocks OUT1 to OUTn may fall at a time point delayed by a time point delayed by a time from the pulse falling time points of the pre-clocks POUT1 to POUTn to a pulse falling time point of the timing control signal IN.

In the example of FIG. 7, the timing control signal IN may include a first pulse 71 overlapped with the rising edge of the first pre-clock POUT1 and a second pulse 72 overlapped with the falling edge of the pre-clock POUT1. In this case, the first clock adjustment part 1001 adjustsor sets the rising time point of the first output clock OUT1 by delaying the rising time point of the first pre-clock POUT1 to the falling edge of the first pulse 71, and adjusts or sets the falling time point of the first output clock OUT1 by delaying the falling time point of the first pre-clock POUT1 to the falling edge of the second pulse 72.

The first clock generation circuit TX may be embedded in any one of the timing controller 130, the drive IC D-IC, and the source drive IC 110*a*. The level shifters 140 to 142 may include the second clock generation circuit RX and the clock adjustment parts 1001 to 100*n*.

FIGS. 8A to 8D are waveform diagrams illustrating examples of setting a rising time point, a pulse width, and a falling time point of an output clock OUT1 using a pre-clock POUT1 and a timing control signal IN.

Figure 8A:
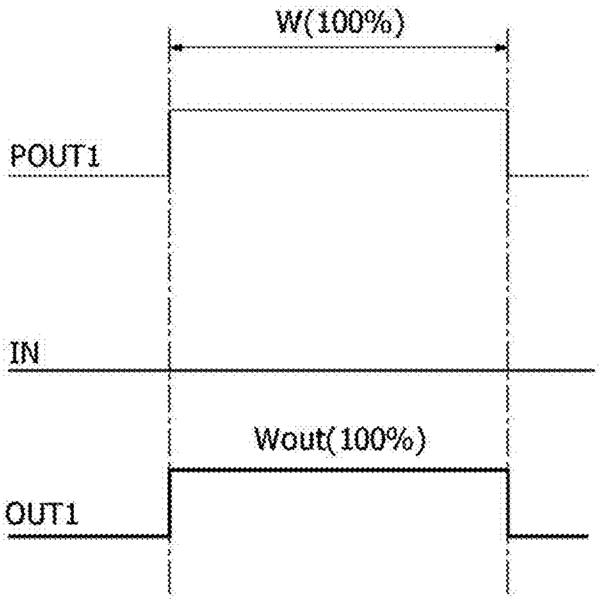
FIGS. 8A to 8D are waveform diagrams illustrating examples of adjusting a rising time point, a pulse width, and a falling time point of an output clock using a pre-clock and a timing control signal.

Referring to FIG. 8A, a pulse of the timing control signal IN may not be overlapped with a rising edge and a falling edge of the pre-clock POUT1. In this case, the clock adjustment part 1001 outputs the same output clock OUT1 as the first pre-clock POUT1 without delay. In this case, the rising time point, the pulse width, and the falling time of the first output clock OUT1 are the same as those of the first pre-clock POUT1.

Figure 8B:
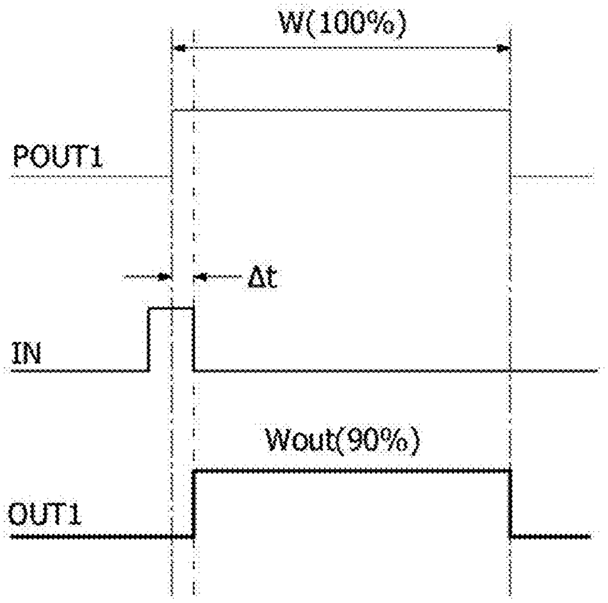

Referring to FIG. 8B, the pulse of the timing control signal IN overlaps with the rising edge of the pre-clock signal POUT1. In this case, the clock adjustment part 1001 delays the pre-clock POUT1 by a delay time Δt from the rising time point of the pre-clock POUT1 to the pulse falling time point of the timing control signal IN. As a result, the output clock OUT1 rises after the pre-clock (POUT1) rises, and the output clock OUT1 falls at the same time as the pre-clock POUT1 falls. In this case, the pulse width of the output clock OUT1 is smaller than the pulse width of the corresponding the pre-clock POUT1. For example, when a pulse width W of the pre-clock POUT1 is 100%, the delay time Δt may be 10% and a pulse width Wout of the output clock OUT1 may be 90%. Δt is not limited to FIG. 8B. For one example, as shown in FIG. 9, Δt may be a fine time of time resolution possible at high frequencies, such as t1=10%, t2=20%, t3=30%, t4=40% of one clock cycle (T in FIGS. 12A and 12B) of the input clock CLK received through a serial interface.

Figure 8C:
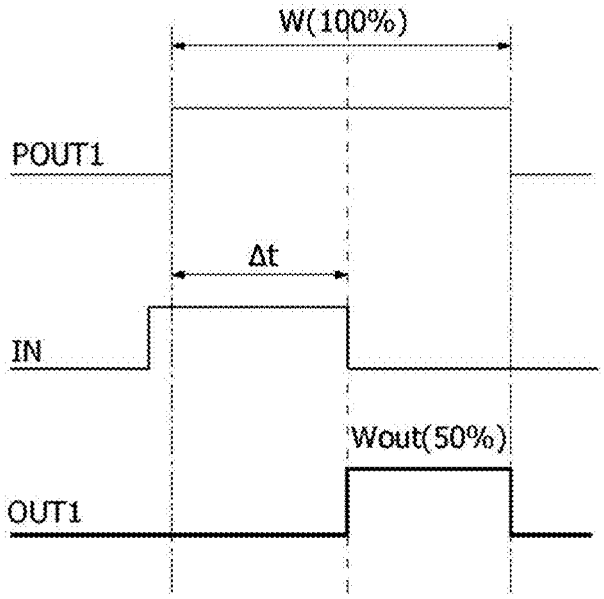

Referring to FIG. 8C, the pulse width of the timing control signal IN overlapped with the rising edge of the pre-clock POUT1 is increased, so that the delay time Δt may be increased by that amount. For example, the delay time Δt may be increased by 50% compared to the pulse width W of the pre-clock POUT1. In this case, the output clock OUT1 rises after the pre-clock POUT1 rises, and the delay time Δt between them is 50% of the pulse width W of the pre-clock POUT. In this case, the pulse width Wout of the output clock OUT1 is reduced to 50% compared to the pulse width W of the pre-clock POUT1.

Figure 8D:
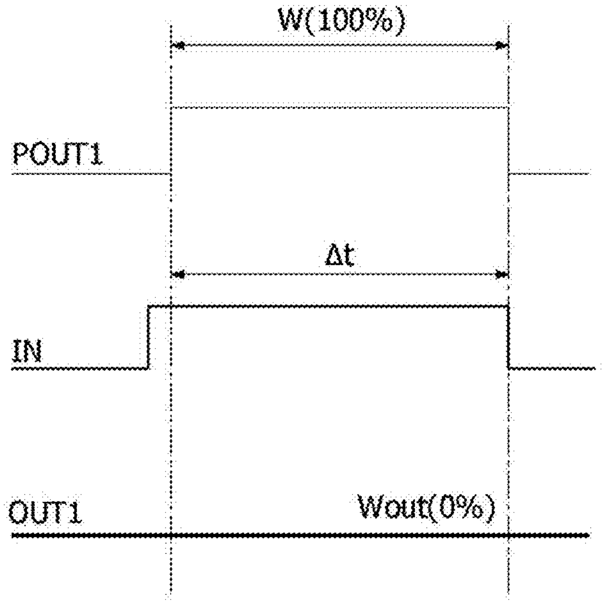

Referring to FIG. 8D, in a period in which the pulse of the timing control signal IN does not fall within the pulse width W of the pre-clock POUT1, the pulse of the output clock OUT1 is not generated.

Figure 9:
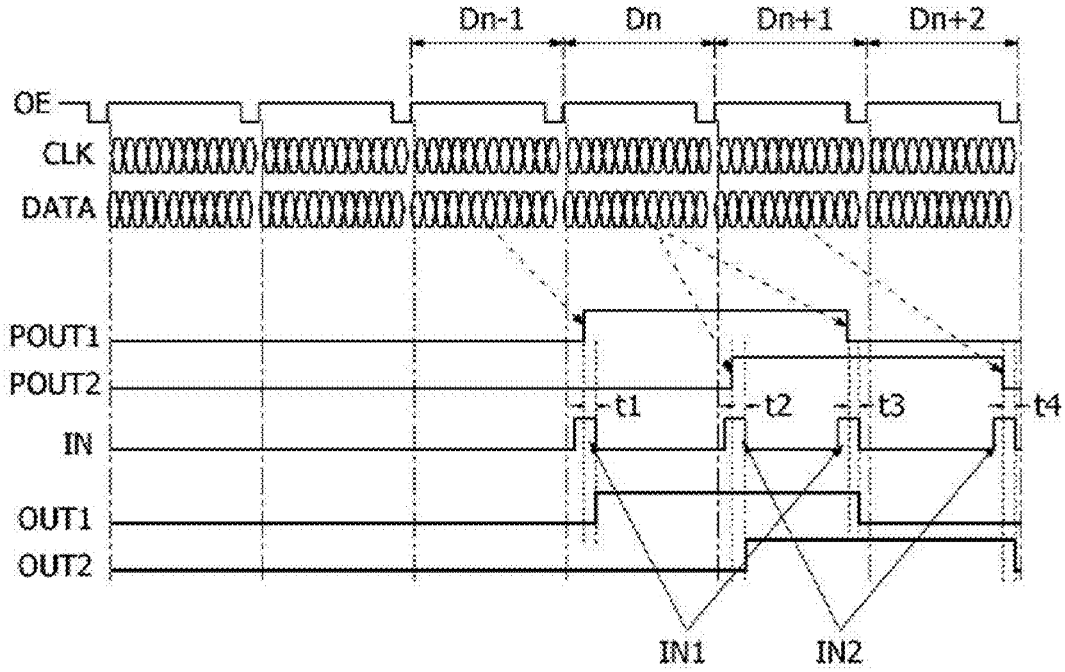
FIG. 9 is a waveform diagram illustrating one example of a pre-clock, a timing control signal, and an output clock according to an embodiment of the present disclosure.

Each of the clock adjustment parts 1001 to 100*n* may finely adjust a rising time point, a pulse width, and a falling time point of the output clock, respectively, as shown in FIG. 9 using a delay circuit.

Referring to FIG. 9, a first pulse of the first timing control signal IN1 overlaps with the rising edge of the first pre-clock POUT1, and a second pulse of the first timing control signal IN1 may be overlapped on the falling edge of the first pre-clock POUT1.

Figure 12A:
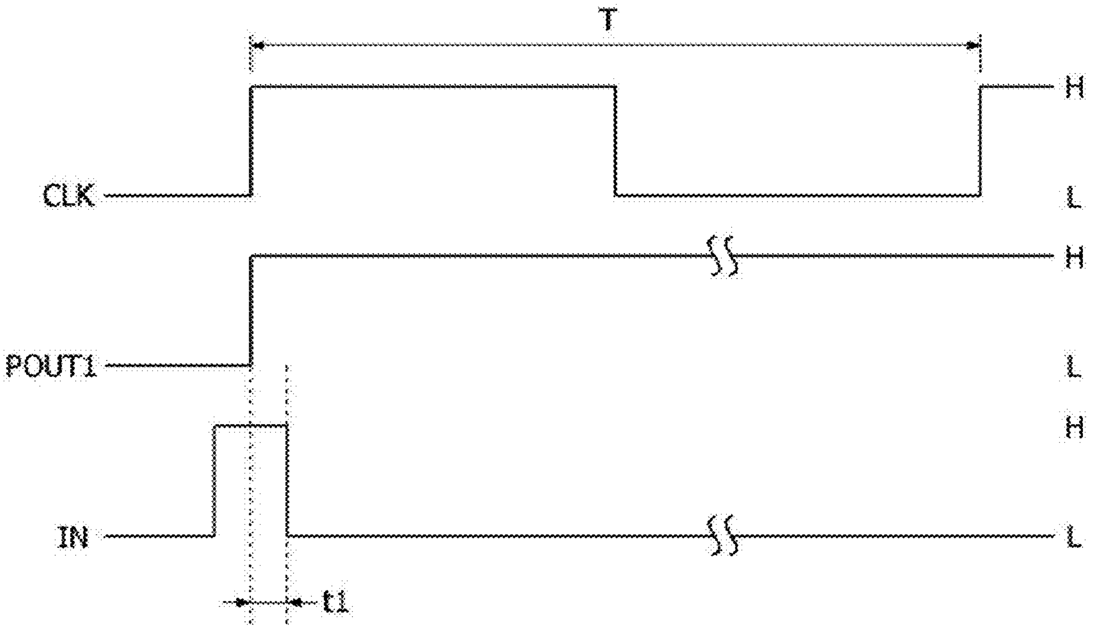
FIGS. 12A and 12B are enlarged waveform diagrams of pulses of a clock, a pre-clock, and a timing control signal shown in FIG. 11.
Figure 12B:
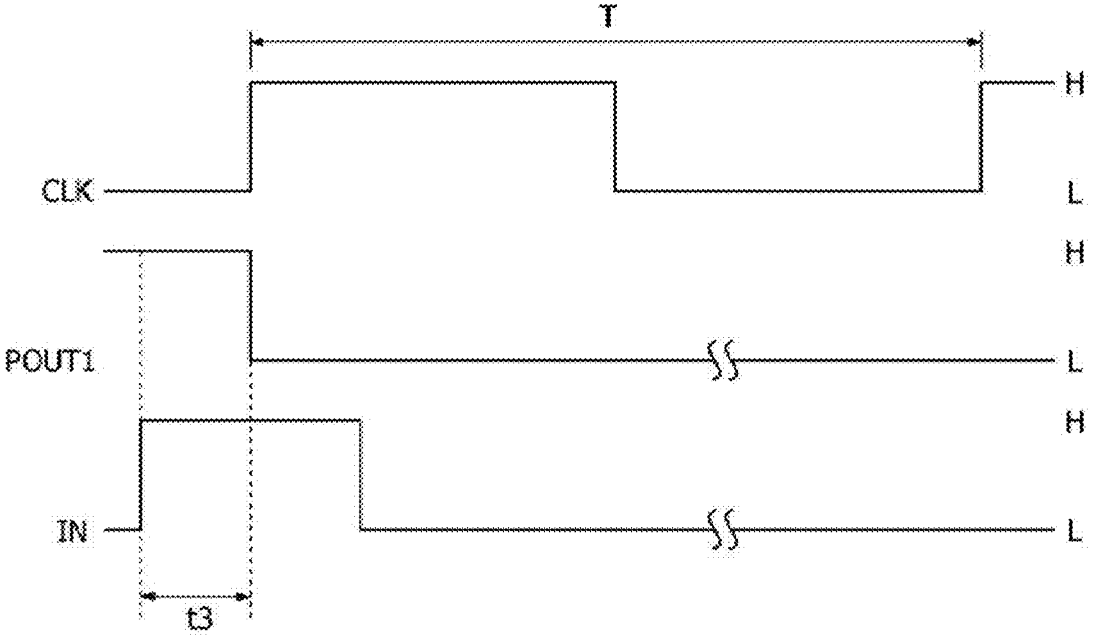

A delay time t1 from the rising time point of the first pre-clock POUT1 to the falling time point of the first pulse of the first timing control signal IN1 may be set to 10% of one clock cycle of the input clock CLK as shown in FIG. 12A, but is not limited thereto. A delay time t3 from the falling time point of the first pre-clock POUT1 to the falling time point of the second pulse of the first timing control signal IN1 may be set to 30% of one clock cycle as shown in FIG. 12B, but is not limited thereto. Thus, first timing control signal IN1 can be considered synchronized to the clock CLK in the broad meaning of the term because it is set to 10% of the frequency in one embodiment and at 30% in another embodiment.

In this case, the first output clock OUT1 from the first clock adjustment part 1001 may rise at a time delayed by 10% of one clock cycle T from the rising time point of the first pre-clock POUT1, and may fall at a time delayed by 30% of one clock cycle from the falling time of the pre-clock POUT1. As a result, the rising time point of the first output clock OUT1 is slightly delayed from the rising time point of the first pre-clock POUT1, and the falling time point of the first output clock OUT1 is slightly delayed from the falling time point of the first pre-clock POUT1. When the rising delay time t1 and the falling delay time t3 are set to be different from each other, the fall width of the first output clock OUT1 may also be finely adjusted.

The first pulse of the second timing control signal IN2 overlaps with the rising edge of the second pre-clock POUT2, and the second pulse of the second timing control signal IN2 overlaps with the falling edge of the second pre-clock POUT2.

The delay time t2 from the rising time point of the second pre-clock POUT2 to the falling time point of the first pulse of the second timing control signal IN2 may be set to 20% of one clock cycle of the input clock CLK, but is not limited thereto. A delay time t4 from the falling time point of the second pre-clock POUT2 to the falling time point of the second pulse of the second timing control signal IN2 may be set to 40% of one clock cycle, but is not limited thereto. In this case, the second output clock OUT2 outputted from the third clock adjustment part 1002 may rise at a time delayed by 20% of one clock cycle from the rising time point of the second pre-clock POUT2, and may fall at a time delayed by 40% of one clock cycle from the falling time point of the second pre-clock POUT2. As a result, the rising time point of the second output clock OUT2 is slightly delayed from the rising time point of the second pre-clock POUT2, and the falling time point of the second output clock OUT2 is slightly delayed from the falling time point of the second pre-clock POUT2. When the rising delay time t2 and the falling delay time t4 are set to be different from each other, the pulse width of the second output clock OUT2 may also be finely adjusted.

Figure 10:
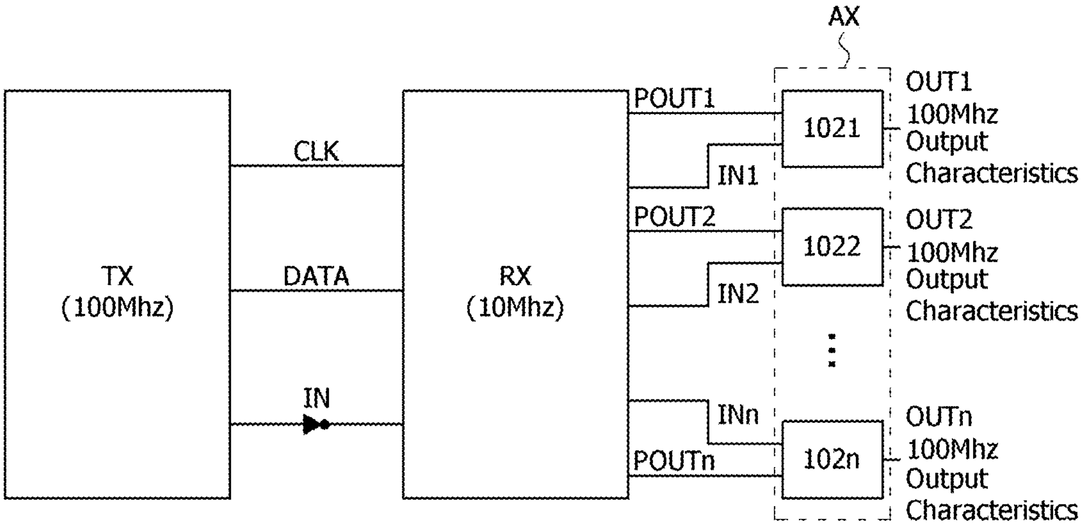
FIG. 10 is a diagram illustrating a clock generator according to a second embodiment of the present disclosure.
Figure 11:
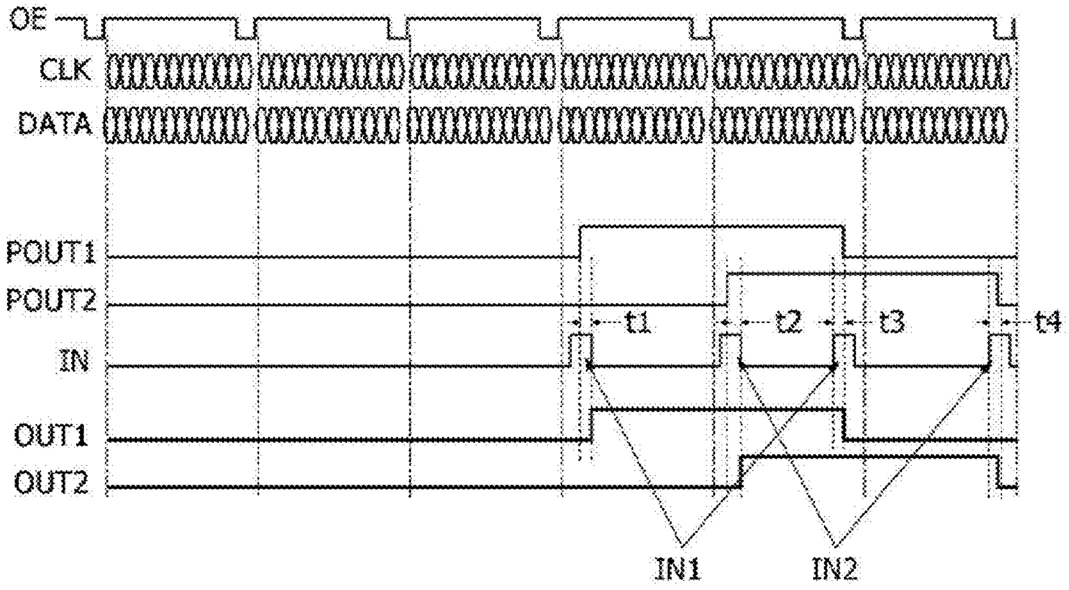
FIG. 11 is a waveform diagram illustrating one example of a pre-clock, a timing control signal, and an output clock shown in FIG. 10.
Figure 13:
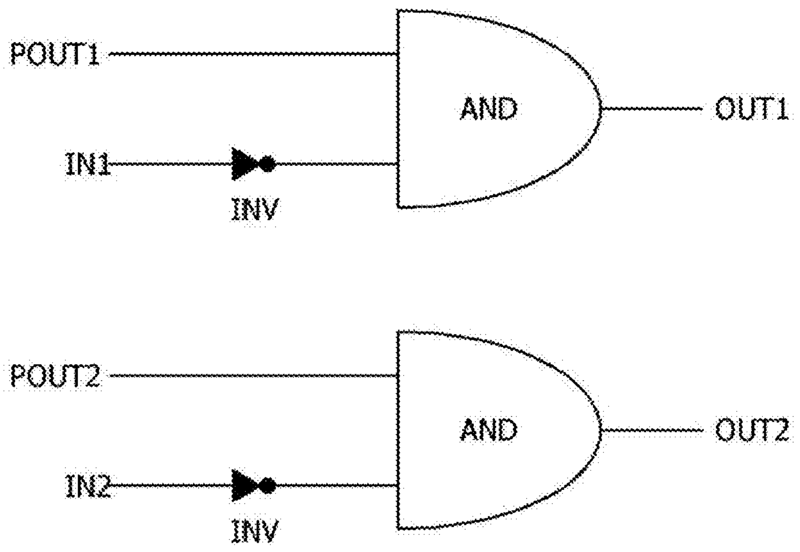
FIG. 13 is a circuit diagram illustrating one example of a filter circuit.

FIG. 10 is a diagram illustrating a clock generator according to an embodiment of the present disclosure. FIG. 11 is a waveform diagram illustrating one example of a pre-clock, a timing control signal, and an output clock shown in FIG. 11. FIGS. 12A and 12B are enlarged waveform diagrams of the clock, the pre-clock, and the timing control signal shown in FIG. 11. FIG. 12A shows one example of the delay time t1 set to 10% of one clock cycle T, and FIG. 12B shows one example of the delay time t3 set to 30% of one clock cycle T. In FIGS. 12A and 12B, 'H' is a high voltage and 'L' is a low voltage. FIG. 13 is a circuit diagram illustrating one example of a filter circuit. In FIGS. 10 to 13, detailed descriptions of components substantially the same as those of the foregoing embodiment are omitted.

Referring to FIGS. 10 to 13, the clock generator includes a first clock generation circuit TX, a second clock generation circuit RX, and a clock adjustment circuit.

The clock adjustment circuit includes clock adjustment parts 1021 to **102*n* respectively connected to channels of the second clock generation circuit RX. Each of the clock adjustment parts 1021 to 102*n* finely adjusts the rising time point and the falling time point of the pre-clocks POUT1 to POUTn using a filter circuit or a combination of a delay circuit and a filter circuit. The filter circuit may include logic circuit elements such as NOT, AND, OR, XOR, NAND, and XNOR. The filter circuit may finely adjust the timing of the pre-clock using a combination of one or more logic circuit elements. For example, the filter circuit may finely adjust one or more of a rising time point, a pulse width, and a falling time point of the pre-clocks POU1 and POUT2 and may output the clocks OUT1 and OUT2 by using an AND gate that outputs a logical product result of the timing control signals IN1 and IN2 inverted by a NOT gate INV and the pre-clocks POUT1 and POUT2, as shown in FIG. 13**.

The clock adjustment parts 1021 to **102*n* may finely adjust one or more of the rising time point, the pulse width, and the falling time point of each of the first to n-th pre-clocks POUT1 to POUTn sequentially inputted from the second clock generation circuit RX by using a delay circuit and a filter circuit. Accordingly, the clock adjustment parts 1021 to 102*n* output the first to n-th output clocks OUT1** to OUTn in which timings are finely adjusted with a time resolution at a high frequency, for example, 100 MHz.

The first pulse of the first timing control signal IN1 overlaps with the rising edge of the first pre-clock POUT1, and the second pulse of the first timing control signal IN1 overlaps with the falling edge of the first pre-clock POUT1. The second pre-clock POUT2 rises after the first pre-clock POUT1 rises and its high period may be overlapped with the high period of the first pre-clock POUT1. The first pulse of the second timing control signal IN2 overlaps with the rising edge of the second pre-clock POUT2, and the second pulse of the second timing control signal IN2 may be overlapped with the falling edge of the second pre-clock POUT2.

The clock adjustment parts 1021 to **102*n* may cause the output clocks OUT1 to OUTn to rise at a time point later than the rising time point of the pre-clocks POUT1 to POUTn by using a delay circuit, and may cause the output clocks OUT1 to OUTn to fall a time point earlier than the falling time point of the pre-clocks POUT1 to POUTn using a filter circuit. In an embodiment, the clock adjustment parts 1021 to 102*n* may cause the output clocks OUT1 to OUTn to rise at a time point earlier than the rising time point of the pre-clocks POUT1 to POUTn using a filter circuit, and may cause the output clocks OUT1 to OUTn to fall at a time point later than the falling time point of the pre-clocks POUT1 to POUTn by using a delay circuit. In an embodiment, the clock adjustment parts 1021 to 102*n* may cause the output clocks OUT1 to OUTn to rise at a time point earlier than the rising time point of the pre-clocks POUT1 to POUTn using a filter circuit, and may cause he output clocks OUT1 to OUTn to fall at a time point earlier than the falling time point of the pre-clocks POUT1** to POUTn.

FIG. 13 shows that the output clocks OUT1 to OUTn rise at a time point later than the rising time point of the pre-clocks POUT1 to POUTn, and the output clocks OUT1 to OUTn fall at a time point earlier than the falling time point of the pre-clocks POUT1 to POUTn as an example, but is not limited thereto. In the example of FIG. 13, the delay time t1 from the rising time point of the first pre-clock POUT1 to the falling time point of the first pulse of the first timing control signal IN1 may be set to 10% of one clock cycle. The time t3 from the rising time point of the second pulse of the first timing control signal IN1 to the falling time point of the first pre-clock POUT1 may be set to 30% of one clock cycle. In this case, the first output clock OUT1 may rise at a time point delayed by 10% of one clock cycle from the rising time point of the first pre-clock POUT1, and may fall a time point earlier than the falling time point of the first pre-clock POUT1 by 30% of one clock cycle.

In the example of FIG. 13, the delay time t2 from the rising time point of the second pre-clock POUT2 to the falling time of the first pulse of the second timing control signal IN2 may be set to 10% of one clock cycle, but is not limited thereto. The time t4 from the rising time point of the second pulse of the second timing control signal IN2 to the falling time of the second pre-clock POUT2 may be set to 40% of one clock cycle, but is not limited thereto. In this case, the second output clock OUT2 may rise at a time point delayed by 20% of one clock cycle from the rising time point of the second pre-clock POUT2, and may fall at a time point earlier than the falling time point of the second pre-clock POUT2 by 40% of one clock cycle.

Figure 14:
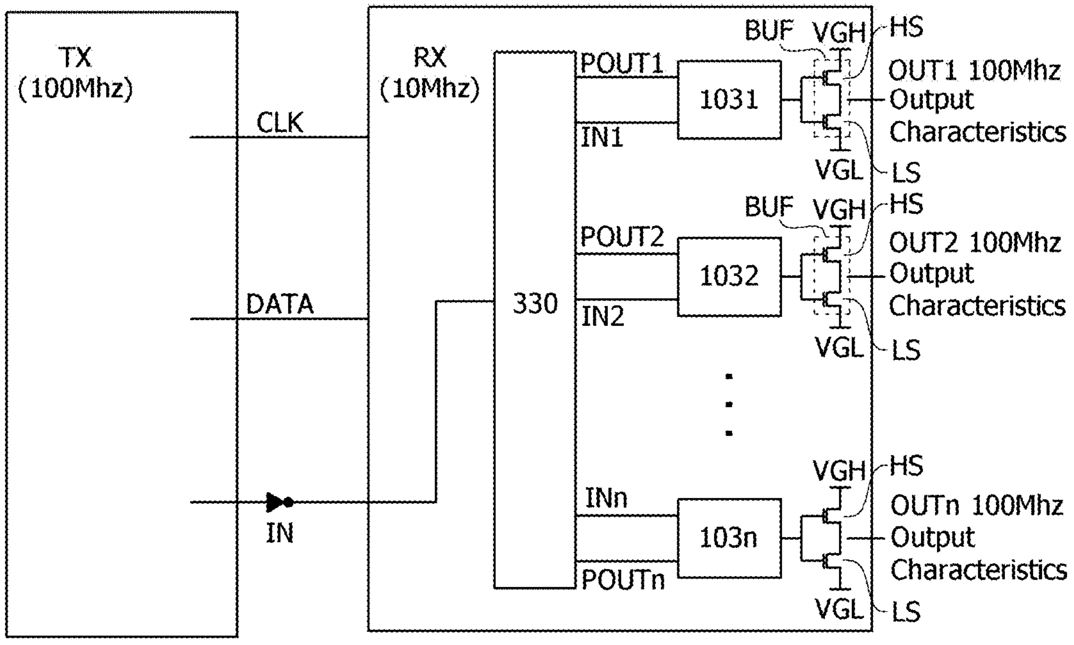
FIG. 14 is a diagram illustrating a clock generator according to a third embodiment of the present disclosure.

FIG. 14 is a diagram showing a clock generator according to an embodiment of the present disclosure.

Referring to FIG. 14, a first clock generation circuit TX may be connected to a second clock generation circuit RX through a first wiring through which a clock CLK is serially transmitted, a second wiring through which data DATA is serially transmitted, and a third wiring through which a timing control signal IN serially transmitted.

The second clock generation circuit RX may include a pre-clock generation part 330, clock adjustment parts 1021 to **102*n*, and an output buffer BUF. The pre-clock generation part 330 generates pre-clocks POUT1 to POUT2 sequentially shifted depending on data values, and separates the timing control signal IN for each channel to provide the corresponding clock adjustment parts 1031 to 103*n*. Each of the clock adjustment parts 1031 to 103*n* may generate output clocks OUT1** to OUTn having a time resolution smaller than one clock cycle T by using a delay circuit and/or a filter circuit.

The pre-clock generation part 330 and the output buffer BUF may be applied to all embodiments. The output buffer BUF receives the output clocks OUT1 to OUTn from the clock adjustment parts 1021 to **102*n* in each of the channels of the second clock generation circuit RX, and shifts low voltages and high voltages of the output clocks OUT1 to OUTn, such that a swing width of the clock voltage may be increased. The first output buffer BUF converts a swing width between the high voltage and the low voltage of the first output clock OUT1 outputted from the first clock adjustment part 1021 into a swing width between a gate high voltage VGH and a gate low voltage VGL and outputs the converted swing width to a gate driver 120. The second output buffers HS and LS convert a swing width between the high voltage and the low voltage of the second output clock OUT2 outputted from the second clock adjustment part 1022 into a swing width between the gate high voltage VGH and the gate low voltage VGL and outputs the converted swing width to the gate driver 120**.

The output buffer BUF includes a pull-up transistor HS and a pull-down transistor LS. The pull-up transistor HS is turned on in response to the high voltage of the output clocks OUT1 to OUTn to supply the gate high voltage VGH to an output node. In this case, the gate pulse applied to the gate line of the display panel 100 through the gate driver 120 may rise to the gate high voltage VGH. The pull-down transistor LS is turned on in response to the low voltage of the output clocks OUT1 to OUTn to discharge the voltage of the output node to the gate low voltage VGL. In this case, the voltage of the gate pulse applied to the gate line of the display panel 100 through the gate driver 120 is lowered to the gate low voltage VGL.

Figure 15:
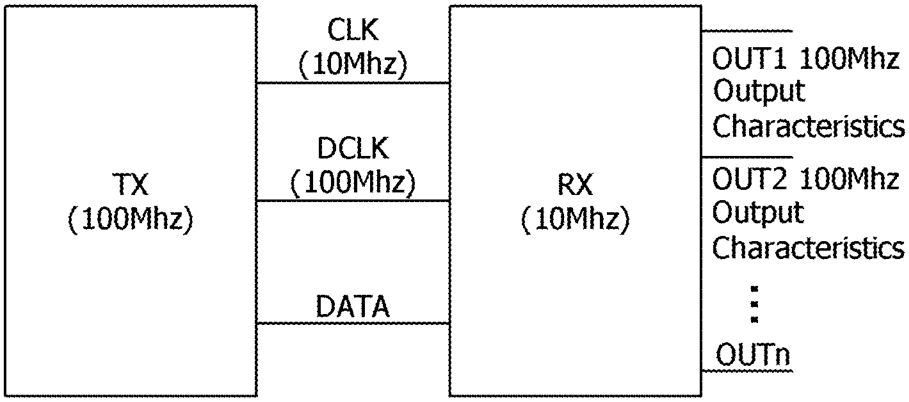
FIG. 15 is a diagram illustrating a clock generator according to a fourth embodiment of the present disclosure.
Figure 16:
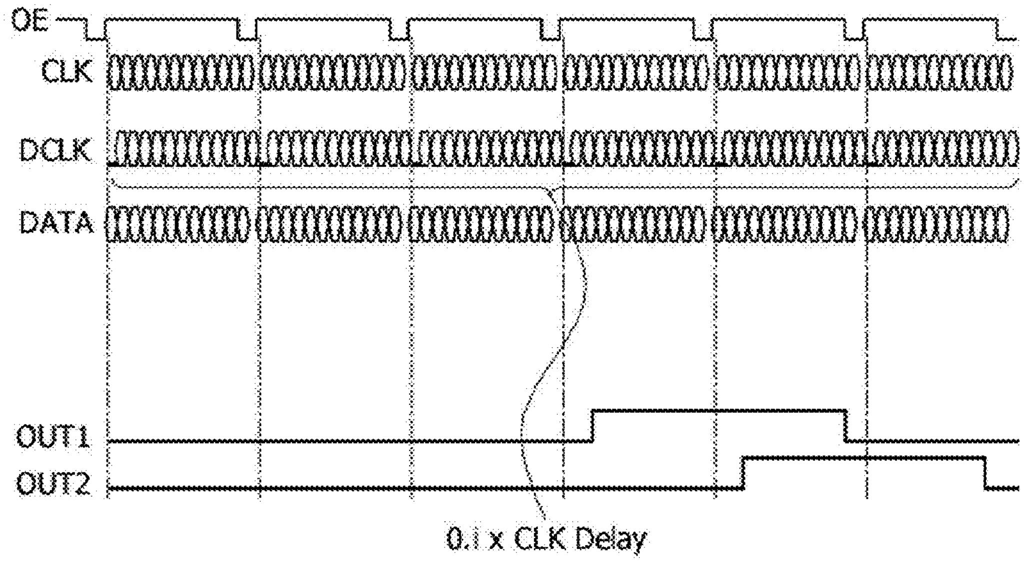
FIG. 16 is a waveform diagram illustrating one example of a pre-clock, a timing control signal, and an output clock shown in FIG. 15.

FIG. 15 is a diagram showing a clock generator according to an embodiment of the present disclosure. FIG. 16 is a waveform diagram showing one example of a clock, a timing control signal, and an output clock. In FIGS. 15 and 16, detailed descriptions of substantially the same components as those of the foregoing embodiment are omitted.

Referring to FIGS. 15 and 16, the first clock generation circuit TX may be connected to the second clock generation circuit RX through a first wiring through which clock CLK is serially transmitted, a second wiring through which data DATA is serially transmitted, and a third wiring through which a timing control signal DCLK is serially transmitted. The timing control signal DCLK may be a clock that is delayed by a time smaller than one clock cycle of the clock CLK (0. i X CLK delay, i is a natural number) compared to the non-delayed clock CLK.

The second clock generation circuit RX counts the clock CLK or the clock of the delayed timing control signal DCLK as much as a designated rising value of the data DATA to cause the output clocks OUT1 to OUTn to rise, and counts the clock CLK or the clock of the delayed timing control signal DCLK as much as a designated falling value of the data DATA to cause the output clocks OUT1 to OUTn to fall, such that the pre-clocks POUT1 to POUTn in which phases are sequentially shifted may be generated. The second clock generation circuit RX generates the output clocks OUT1 to OUTn in which the timing is finely adjusted by the time difference between the clock CLK and the clock of the timing control signal DCLK. When the delay clock of the timing control signal DCLK is a clock delayed by 10% compared to one clock cycle T of the non-delayed clock CLK, the rising time point and/or falling time point of the output clocks OUT1 to OUTn may be fine-adjusted as much as 10% of one clock cycle.

The second clock generator circuit RX may secondarily finely adjust the pre-clock outputted from the delay circuit and/or the clock circuit and/or the output clock in which timing is primarily finely adjusted by the time difference between the clock CLK and the delayed timing control signal clock DCLK. For example, the second clock generation circuit RX may cause the pre-clocks POUT1 to POUTn to rise based on a value obtained by counting the clock or delay clock as much as a designated rising value of the data DATA, and may cause the pre-clocks POUT1 to POUTn to fall based on a value obtained by counting the clock or delay clock as much as a designated falling value of the data DATA, such that the output clocks OUT1 to OUTn may be finely adjusted.

Figure 17:
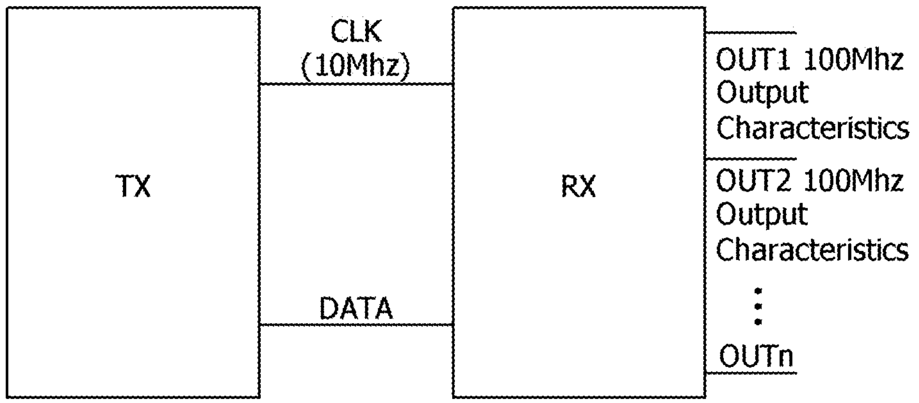
FIG. 17 is a diagram illustrating a clock generator according to a fifth embodiment of the present disclosure.
Figure 18:
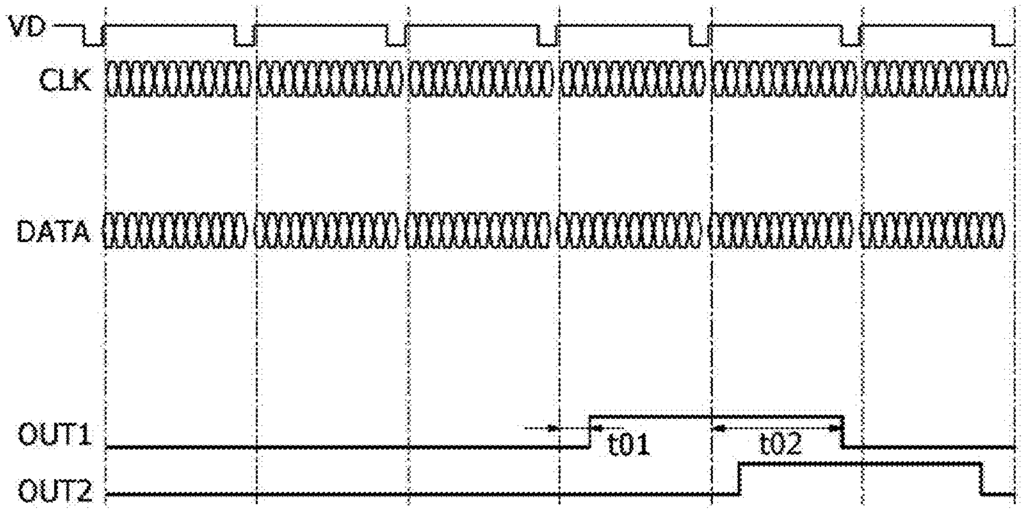
FIG. 18 is a waveform diagram illustrating one example of the clock, the data and the output clock shown in FIG. 17.
Figure 19:
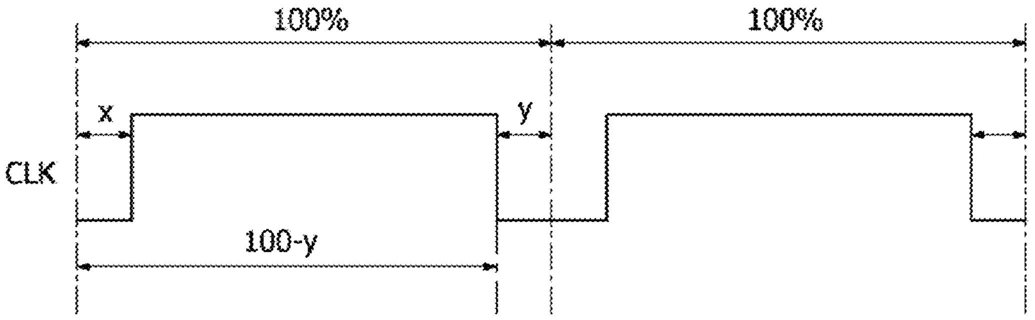
FIG. 19 is a waveform diagram illustrating a rising time point and a falling time point of a clock generated by a first clock generation circuit.

FIG. 17 is a diagram showing a clock generator according to an embodiment of the present disclosure. FIG. 18 is a waveform diagram showing one example of a clock, data, and an output clock shown in FIG. 17. FIG. 19 is a waveform diagram showing a rising time point and a falling time point of a clock generated by a first clock generation circuit. In FIGS. 17 and 18, detailed descriptions of components substantially the same as those of the above-described embodiment are omitted.

Referring to FIGS. 17 and 18, the first clock generation circuit TX may be connected to the second clock generation circuit RX through a first wiring through which the clock CLK is serially transmitted and a second wiring through which the data DATA is serially transmitted.

The first clock generation circuit TX may fix one clock cycle of the clock CLK and finely vary the pulse rising time point and the pulse falling time point of the clock CLK within one clock cycle. When one clock cycle of the input clock is 100% as shown in FIG. 19, if a time from the start of one clock cycle to the rising time point of the clock pulse is referred to as "designated rising value (number of CLKs)+x %," and a time from the falling time point of the clock pulse to the end of one clock cycle is referred to as "designated falling value (number of CLKs)+(100−y %)," the first clock generation circuit TX may vary x and y, and may determine a fine adjustment width of the output clock.

The second clock generation circuit RX may count the clock CLK as much as the designated rising value of the data DATA and cause the output clocks OUT1 to OUTn to rise when the count value reaches the designated rising value, and may count the clock CLK as much as the designated falling value of the data DATA and cause the output clocks OUT1 to OUTn to fall when the count value reaches the designated falling value, such that the output clocks OUT1 to OUTn in which phases are sequentially shifted may be generated. In this case, the rising time point and the falling time point of the output clocks OUT1 to OUTn may be finely changed by x % and y % smaller than one clock cycle. As a result, when x % and y % are changed, the rising time point and the falling time point of the output clocks OUT1 to OUTn outputted from the second clock generation circuit RX may be varied within a time smaller than one clock cycle. In FIG. 18, the output clock OUT1 rises at a time point delayed by a time t01 in which x % is added to the designated rising value of the data DATA, and the output clock OUT1 falls at a time point delayed by a time in which 100-y % is added to the designated falling value of the data DATA.

This embodiment may be used to fine-adjust the timings of the pre-clocks of the above-described embodiments. For example, when the timing of the clock generated from the first clock generation circuit TX is varied, the timing of the pre-clock generated from the second clock generation circuit RX may be varied.

Figure 20:
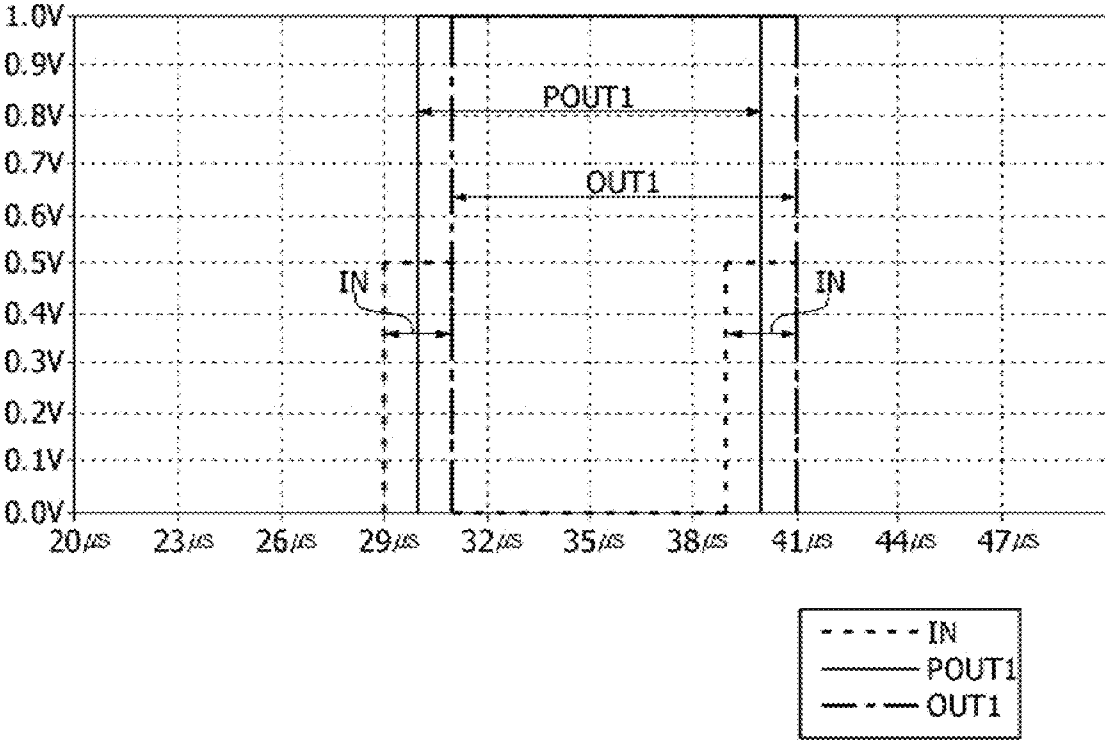
FIGS. 20 and 21 are simulation results for performance verification of a clock generator according to an embodiment of the present disclosure.
Figure 21:
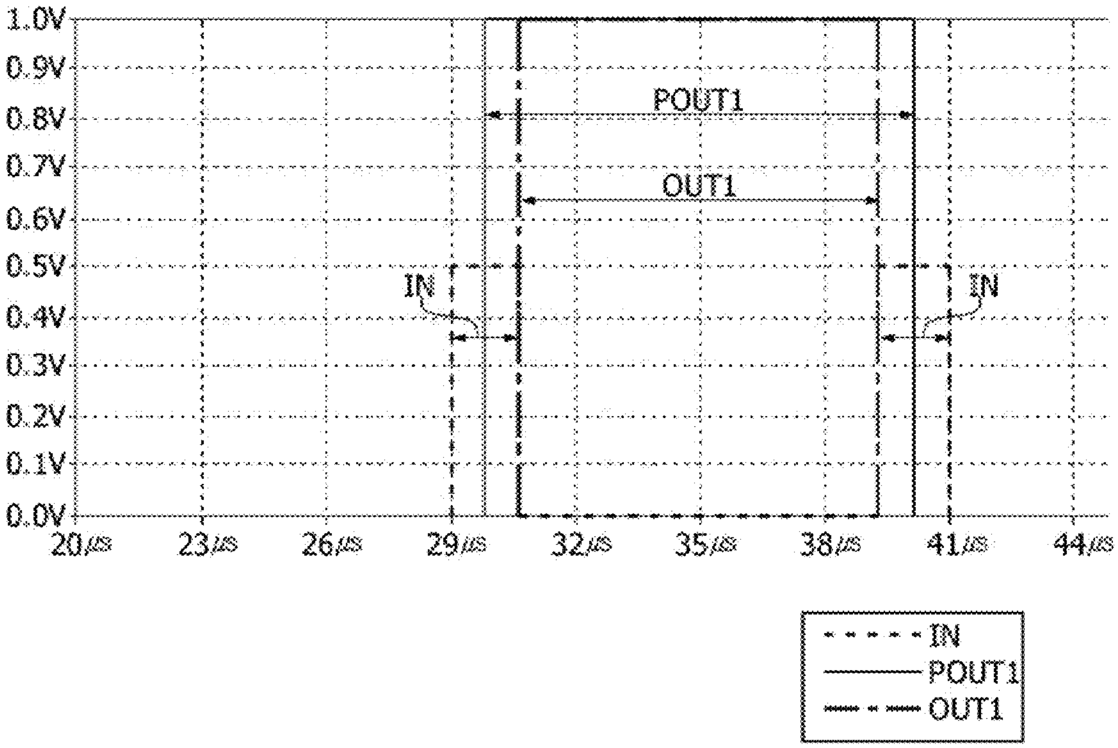

FIGS. 20 and 21 are simulation results for performance verification of a clock generator according to an embodiment of the present disclosure. FIG. 20 is a simulation result for an embodiment (FIG. 9) using a delay circuit, and FIG. 21 is a simulation result for an embodiment (FIG. 11) using a filter circuit shown in FIG. 13.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A clock generator comprising:

a first clock generation circuit configured to generate a clock and data synchronized with the clock;

a first wiring connected to the first clock generation circuit to transmit the clock;

a second wiring connected to the first clock generation circuit to transmit the data; and a second clock generation circuit connected to the first clock generation circuit through the first wiring and the second wiring and configured to count the clock based on the data and cause a pulse of output clocks to rise and fall to generate the output clocks in which phases are sequentially shifted based on the data and the clock, wherein the second clock generation circuit is configured to vary, based on a timing control signal, one or more of a pulse rising time point of a pulse of the clock or a pulse falling time point of the pulse of the clock within one clock cycle of the clock, the timing control signal having one or more of a first control pulse corresponding to the pulse rising time point of the pulse of the clock or a second control pulse corresponding to the pulse falling time point of the pulse of the clock, and the varying being determined based on one or more of a first delay time between a first edge of the first control pulse and the pulse rising time point of the pulse of the clock or a second delay time between a second edge of the first control pulse and the pulse falling time point of the pulse of the clock, and wherein the second clock generation circuit is configured to fix the one clock cycle of the clock, and vary a first time from a start time to a rising time of the one clock cycle and a second time from a falling time to an end time of the one clock cycle within the fixed one clock cycle.

2. The clock generator of claim 1, wherein the clock rises at a time point delayed by the first time, and the output clock falls at a time point ahead by the second time.

3. A display device comprising:

a display panel including a plurality of pixel circuits, in which each of the pixel circuits is connected to a data line and a gate line;

a data driver configured to output a data signal applied to the data line;

a gate driver configured to receive a clock and supply a gate pulse to the gate line; and a clock generator configured to supply the clock to the gate driver, wherein the clock generator includes:

a first clock generation circuit configured to generate a clock and data synchronized with the clock;

a first wiring to the first clock generation circuit to transmit the clock;

a second wiring to the first clock generation circuit to transmit the data; and a second clock generation circuit connected to the first clock generation circuit through the first wiring and the second wiring and configured to count the clock based on the data and cause a pulse of output clocks to rise and fall to generate the output clocks in which phases are sequentially shifted based on the data and the clock, wherein the first clock generation circuit is configured to vary one or more of a pulse rising time point of a pulse of the clock or a pulse falling time point of the pulse of the clock within one clock cycle of the clock, wherein the first clock generation circuit is configured to fix the one clock cycle of the clock, and vary a first time from a start time to a rising time of the one clock cycle and a second time from a falling time to an end time of the one clock cycle within the fixed one clock cycle.

4. The display device of claim 3, wherein the clock rises at a time point delayed by the first time, and the output clock falls at a time point ahead by the second time.

5. A clock generator comprising:

a first clock generation circuit configured to output a clock, data synchronized with the clock, and a timing control signal each in serial transmission;

a second clock generation circuit connected to the first clock generation circuit and configured to count the clock based on the data and cause a pulse of pre-clocks to rise and fall to generate the pre-clocks in which phases are sequentially shifted based on the data and the clock; and a clock adjustment circuit configured to adjust at least one of a rising time point, a pulse width, or a falling time point of a pulse of a pre-clock based on the timing control signal, wherein:

a frequency of each of the timing control signal and the pre-clocks is lower than a frequency of the clock and the data, the timing control signal includes at least one pulse overlapped with any one of the pre-clocks, the timing control signal having one or more of a first control pulse corresponding to the pulse rising time point of the pulse of the clock or a second control pulse corresponding to the pulse falling time point of the pulse of the clock, and the adjusting is determined based on one or more of a first delay time between a first edge of the first control pulse and the pulse rising time point of the pulse of the clock or a second delay time between a second edge of the first control pulse and the pulse falling time point of the pulse of the clock.

6. The clock generator of claim 5, wherein the second clock generation circuit is configured to separate pulses of the timing control signal that are serially received by the second clock generation circuit into a plurality of parallel timing control signals corresponding to the pre-clocks, respectively.

7. The clock generator according to claim 5, further comprising:

an output buffer configured to increase a swing width of the output clock, wherein the clock adjustment circuit and the output buffer are included in the second clock generation circuit.

8. The clock generator according to claim 5, wherein the timing control signal includes a delayed clock delayed from the clock by a time period less than one clock cycle of the clock, and the second clock generation circuit is configured to cause the pre-clock to rise by a designated rising value of the data based on a first value obtained by counting the clock or the delayed clock, and to cause the pre-clock to fall by a designated falling value of the data based on a second value obtained by counting the clock.

9. The clock generator according to claim 5, wherein the pulse of the timing control signal overlaps with at least one of the rising time point or the falling time point of the pulse of the pre-clock.

10. The clock generator according to claim 9, wherein a pulse width of the timing control signal is smaller than a pulse width of the pulse of the pre-clock.

11. The clock generator according to claim 9, wherein when the pulse of the timing control signal overlaps with a rising edge of the pulse of the pre-clock, the pulse of the timing control signal rises before the rising time point of the pulse of the pre-clock and falls after the rising time point of the pulse of the pre-clock, and when the pulse of the timing control signal overlaps with a falling edge of the pulse of the pre-clock, the pulse of the timing control signal rises before the falling time point of the pulse of the pre-clock and falls after the falling time point of the pulse of the pre-clock.

12. The clock generator according to claim 11, wherein a time period in which the pulse of the timing control signal overlaps with the pulse of the pre-clock is less than one clock cycle of the clock.

13. The clock generator according to claim 9, wherein the clock adjustment circuit includes a delay circuit configured to delay the pre-clocks and output the output clock, when the pulse of the timing control signal overlaps with a rising edge of the pulse of the pre-clock, the pulse of the output clock rises at a time point delayed by a time period from the rising time point of the pulse of the pre-clock to a falling time point of the pulse of the timing control signal; and when the pulse of the timing control signal overlaps with a falling edge of the pulse of the pre-clock, the pulse of the output clock falls at a time point delayed by a time period from the falling time point of the pulse of the pre-clock to the falling time point of the pulse of the timing control signal.

14. The clock generator according to claim 9, wherein the clock adjustment circuit includes a filter circuit having one or more logic circuit elements and configured to generate the output clock, and when the pulse of the timing control signal overlaps with a falling edge of the pulse of the pre-clock, a pulse of the output clock falls at a rising time point of the pulse of the timing control signal before a falling time point of the pulse of the pre-clock signal.

* * * * *